United States Patent
Pozsgay

(10) Patent No.: US 7,567,789 B2
(45) Date of Patent: Jul. 28, 2009

(54) METHOD AND DEVICE FOR GENERATING TWO SIGNALS IN PHASE QUADRATURE FOR A FREQUENCY TRANSPOSITION IN A CELLULAR MOBILE TELEPHONE

(75) Inventor: Andras Pozsgay, Contamine sur Arve (FR)

(73) Assignee: STMicroelectronics N.V., Amsterdam (NL)

( * ) Notice: Subject to any disclaimer, the term of this patent is extended or adjusted under 35 U.S.C. 154(b) by 432 days.

(21) Appl. No.: 11/382,553

(22) Filed: May 10, 2006

(65) Prior Publication Data
US 2006/0258314 A1   Nov. 16, 2006

(30) Foreign Application Priority Data
May 11, 2005   (EP)   ................................. 05010229

(51) Int. Cl.
H04B 7/00 (2006.01)
H04B 1/00 (2006.01)
(52) U.S. Cl. .................. 455/260; 455/317; 455/326
(58) Field of Classification Search ................ 455/255, 455/260, 76, 86, 75, 77, 84, 87, 324, 112, 455/126, 314, 315, 316, 317, 259, 326; 331/16, 331/25; 375/219
See application file for complete search history.

(56) References Cited

U.S. PATENT DOCUMENTS

| | | | |
|---|---|---|---|
| 6,016,422 A | 1/2000 | Bartusiak | 455/76 |
| 6,181,212 B1 | 1/2001 | Khoini Poorfard et al. | 331/16 |
| 6,483,388 B2* | 11/2002 | Khan | 331/18 |
| 6,711,397 B1* | 3/2004 | Petrov et al. | 455/324 |
| 6,961,546 B1* | 11/2005 | Rofougaran et al. | 455/118 |
| 6,963,620 B2 | 11/2005 | Lee et al. | 375/295 |
| 6,975,838 B1* | 12/2005 | Rofougaran et al. | 455/20 |
| 7,136,622 B2* | 11/2006 | Rofougaran et al. | 455/20 |
| 7,302,248 B2* | 11/2007 | Craninckx | 455/302 |
| 7,365,662 B2* | 4/2008 | Marsili et al. | 341/118 |
| 2004/0106380 A1* | 6/2004 | Vassiliou et al. | 455/73 |

FOREIGN PATENT DOCUMENTS

| EP | 1 315 284 | 5/2003 |
|---|---|---|
| EP | 1 351 378 | 8/2003 |

* cited by examiner

*Primary Examiner*—Sonny Trinh
(74) *Attorney, Agent, or Firm*—Lisa K. Jorgenson; Allen, Dyer, Doppelt, Milbrath & Gilchrist, P.A.

(57) ABSTRACT

The method and device include the generation of two output signals ($I_{RF}$, $Q_{RF}$) in phase quadrature, having a frequency spectrum including a dominant harmonic at a wanted frequency $F_C$. The generation of a periodic basic signal ($V_P$) having a frequency $F_{OSC}$ equal to the product of R and the desired frequency $F_C$ is included, R being a non-integer rational number greater than one and equal to a ratio p/q, in which p is an integer multiple of 4 and q an odd integer. Also included is a processing of the basic signal including, for example, at least a preprocessing having a frequency division by p with elimination of the even harmonics and a frequency multiplication by q.

41 Claims, 22 Drawing Sheets

METHOD AND DEVICE FOR GENERATING TWO SIGNALS IN PHASE QUADRATURE FOR A FREQUENCY TRANSPOSITION IN A CELLULAR MOBILE TELEPHONE

FIELD OF THE INVENTION

The present invention relates to the generation of phase quadrature signals, and in particular radiofrequency (RF) signals intended for the frequency transposition of baseband signals

BACKGROUND OF THE INVENTION

The invention applies advantageously, but not exclusively, to cellular mobile telephones with a direct conversion architecture. To perform a direct uplink conversion in a radiofrequency transmission subsystem, two orthogonal radiofrequency signals having a frequency equal to the wanted output frequency are normally used. These two orthogonal transposition signals are multiplied by a complex baseband signal, represented by two channels I and Q (channel in phase and channel in phase quadrature). The two signals transposed to the output frequency are then summed to provide a resultant output signal.

Now, such a method presents major drawbacks. In practice, normally, the two transposition signals result from an integer frequency division of an oscillator signal produced by a phase-locked loop, and the frequency of which is equal to an integer multiple of the wanted output frequency. Now, since the frequency of the oscillator signal delivered by the phase-locked loop is equal to K times the wanted output frequency, this frequency of the oscillator signal coincides with the Kth harmonic of the output frequency. And, in the case of coupling between the signals transposed to the output frequency and the local oscillator signal of the phase-locked loop, this Kth harmonic generates a phenomenon commonly known to those skilled in the art as "pulling", which degrades the quality of the radiofrequency signal.

Moreover, when K is equal to 2, an error in the duty cycle of the signal delivered by the phase-locked loop provokes a phase error between the two transposition signals which are no longer orthogonal. The result is then a further degradation of the quality of the radiofrequency signal after transposition. This problem can be avoided by choosing a factor K equal to 4, that is, by doubling the frequency of the phase-locked loop. However, this results in an increase in consumption.

This "pulling" problem can prove so crucial, in particular in single-chip devices, that the direct conversion is then replaced by a heterodyne conversion, resolving the problem of "pulling", but leading to far more complex architectures.

SUMMARY OF THE INVENTION

In view of the foregoing background, it is therefore an object of the present invention to provide an approach to address the above-described problem.

An object of the invention is to eliminate the problem of "pulling" originating from the frequency of the oscillator throughout the direct conversion subsystem. A further object of the invention is to eliminate the possible causes of pulling other than those originating directly from the phase-locked loop.

According to one aspect of the invention, there is provided a method of generating two output signals in phase quadrature, having a frequency spectrum including a dominant harmonic at a desired frequency $F_C$. This method includes the generation of a periodic basic signal having a frequency $F_{OSC}$ equal to the product of R and the desired frequency $F_C$, R being a non-integer rational number greater than 1 and equal to a ratio p/q, in which p is an integer multiple of 4 and q an odd integer.

The method also includes a reception of two initial baseband signals in phase quadrature. The method also includes at least one phase or part for frequency division by p of the basic signal, a phase or part for frequency multiplication by q, a phase or part for eliminating even harmonics, and a frequency transposition of the two initial signals with transposition signals derived from one of these phases or parts and having a frequency spectrum including a dominant harmonic at the desired frequency $F_C$.

It should be noted that since the processing includes a frequency transposition of two initial signals, the frequency spectrum of the output signals includes a dominant harmonic, the frequency of which is equal to the wanted frequency $F_C$ + or − the frequency of the initial signals, that is, roughly at the desired frequency since these initial signals are baseband signals, that is, their frequency spectrum is centred around 0 Hz. In other words, this aspect of the invention is based on a non-integer rational division of the basic signal, for example derived from a phase-locked loop. There is then no harmonic of the output signals that coincides with the frequency $F_{OSC}$.

Moreover, the fact of choosing p to be a multiple of 4 means that output signals in quadrature can be generated. Furthermore, by choosing q to be odd and eliminating the even harmonics, it is possible to obtain only the odd harmonics of $F_{OSC}/p$, and consequently to have no harmonic coinciding with the frequency $F_{OSC}$, so eliminating any source of pulling.

Generally, and according to this aspect of the invention, the order in which the various processing phases and the frequency transposition are carried out is immaterial. Thus, in particular, the frequency division by p can be carried out first, followed by the frequency multiplication by q, or vice-versa. Similarly, a frequency transposition can be carried out first followed by an elimination of the even harmonics, or indeed vice-versa.

Thus, as an indication, it would be quite possible to first perform a frequency multiplication by q of the basic signal, for example by using conventional delay-locked loops (DLL, as known to those skilled in the art), then to perform a frequency division by p also directly generating the two signals in quadrature, and this using a frequency divider of conventional structure and known per se. That said, such an approach may prove more complex to implement, given the high frequency values, in certain technologies. Also, it is preferable to first perform a frequency division by p, followed by a frequency multiplication by q.

Thus, according to an embodiment variant of the invention, the processing includes the phase for frequency division by p, the phase for frequency multiplication by q, the phase for elimination of the even harmonics from the signals derived from the frequency multiplication, and the frequency transposition with transposition signals derived from the elimination phase and including only odd harmonics.

According to another possible embodiment variant, the processing includes the phase for frequency division by p, the phase for frequency multiplication by q, the frequency transposition with transposition signals derived from the frequency multiplication phase, and the elimination of the even harmonics from the transposed signals.

In one or other of these variants, the frequency division phase and the frequency multiplication phase advantageously include joint operations performed at the same time and including logical combinations of signals and q-1 signal offsets by multiples of the period or the half-period of the basic signal, each multiple of the period or of the half-period being equal to the product of the period or of the half-period and an integer coefficient taken from the group of integers closest to R or 2R, respectively. The frequency division phase can include a succession of frequency divisions by 2, or more generally, if p is not a multiple of 2, a modulo p count of the basic signal so as to generate a succession of primary signals, and the joint operations include logical combinations of these primary signals with each other and, where appropriate, with the basic signal.

According to another embodiment, the joint operations performed at the same time in the frequency division phase and in the frequency multiplication phase can include the frequency division by p and the q-1 signal offsets by multiples of the period or of the half-period of the basic signal, in particular when using a ring counter of the Johnson counter type. The multiplication phase preferably also includes a signal summation performed after the offset phase so as to deliver two pairs of tertiary periodic signals, each having the frequency $F_C$.

According to an embodiment of the invention, the joint operations include a generation of two pairs of groups of q signals, each having a frequency $F_S$ equal to $F_C/q$, each group including a secondary periodic signal and the q-1 signals offset relative to this secondary periodic signal by the multiples of the period or of the half-period of the basic signal, the q signals of a group of each pair respectively being in phase opposition relative to the q peer signals of the other group of the pair, and in phase quadrature relative to the q signals of the peer group of the other pair. The phase for elimination of the even harmonics includes, for example, two signal subtractions so as to deliver a pair of signals.

There can also be an additional pulling source, due to the fact that even harmonics can be generated at different stages of the transmission subsystem because of the generation of a spurious sum due to the propagation of injected current into the power supply or into ground. The invention also resolves this additional problem, for example by appropriately choosing the width of the pulses of the output signals at the frequency $F_C$. More specifically, the width of the pulses can be doubled.

In other words, according to an embodiment of the invention, the frequency division phase includes the delivery of signals having pulses of width equal to twice the half-period or the period of the basic signal. The use of a Johnson counter, for example, makes it possible to obtain this doubling of the pulse width in a simple manner.

According to another variant of the invention, the processing includes a phase for frequency division by p with elimination of the even harmonics so as to generate two periodic intermediate signals in phase quadrature, each having a frequency $F_S$ equal to $F_C/q$, and of the odd frequency harmonics, a phase for frequency multiplication by q of the two intermediate signals, and the frequency transposition with transposition signals derived from the multiplication phase and including only odd harmonics.

According to an embodiment, fully compatible with a digital technology, for example a logic gate based CMOS technology, the phase for frequency division by p with elimination of the even harmonics includes: successive divisions by 2 or a modulo p count of the basic signal so as to generate primary signals; logical combinations of these primary signals with each other and, where appropriate, with the basic signal so as to generate two pairs of secondary periodic signals each having the frequency $F_S$ (equal to $F_C/q$), the two secondary signals of each pair being in phase quadrature and the two pairs also themselves being in phase quadrature; and subtractions of these secondary signals so as to generate the two intermediate signals Although it is possible to perform the multiplication by q using conventional delay-locked loop circuits that are known per se, it is particularly advantageous, still in the context of the use of a CMOS digital technology, to use delay circuits and adders to perform this multiplication.

More specifically, according to a preferred embodiment of the invention, in which the pair of intermediate signals, each having the frequency $F_S$, includes a first intermediate signal and a second intermediate signal in phase quadrature relative to the first, the phase of frequency multiplication by q includes: q-1 successive offsets of the pair of intermediate signals by multiples of the period or of the half-period of the basic signal so as to obtain q-1 pairs of offset signals, each pair of offset signals including a first offset signal and a second offset signal in phase quadrature relative to the first, each multiple of the period or of the half-period being equal to the product of the period or of the half-period and an integer coefficient taken from the group of integers closest to R or 2R, respectively; the sum of the first intermediate signal and of the q-1 first offset signals; and the sum of the second intermediate signal and the q-1 second offset signals.

The frequency transposition can be performed with the signals directly derived from the multiplication. As a variant, it is possible to choose an appropriate width for the pulses of the transposition signals at the frequency $F_C$ before performing the frequency transposition, and so resolve the problem of additional pulling source.

More specifically, according to an advantageous embodiment of the invention, the frequency multiplication phase delivers a first preprocessed signal and a second preprocessed signal in phase quadrature relative to the first preprocessed signal, and the processing also includes a post-processing of the two preprocessed signals, this post-processing including: an offset of these two preprocessed signals by the period or the half-period of the basic signal so as to obtain a first offset preprocessed signal and a second offset preprocessed signal in phase quadrature relative to the first offset preprocessed signal; the sum of the first preprocessed signal and the first offset preprocessed signal; and the sum of the second preprocessed signal and the second offset preprocessed signal, so as to obtain the two transposition signals. It is, moreover, particularly advantageous to choose q to be equal to 3. In practice, it has been observed that such a choice of values maximized the distancing of the disturbing harmonics.

According to another aspect of the invention, there is also proposed a device for generating two output signals in phase quadrature having a frequency spectrum including a dominant harmonic at a wanted frequency $F_C$, the device comprising: generation means for generating a periodic basic signal having a frequency $F_{OSC}$ equal to the product of R and the desired frequency $F_C$, R being a non-integer rational number greater than one and equal to a ratio p/q, in which p is an integer multiple of 4 and q an odd integer; an input interface for receiving two initial baseband signals in phase quadrature; and processing means connected to the generation means and to the input interface and for performing a processing including at least a phase for frequency division by p of the basic signal, a phase for frequency multiplication by q, a phase for elimination of the even harmonics, and a frequency transposition of the two initial signals with transposition signals derived from one of these phases and having a frequency spectrum including a dominant harmonic at said wanted frequency $F_C$.

According to a variant of the invention, the processing means include a first substage having an input to receive the basic signal and suitable for performing the phase for frequency division by p, a second substage suitable for performing the phase for frequency multiplication by q, a third substage suitable for performing the phase for elimination of the even harmonics of the signals derived from the second substage, and frequency transposition means connected to the input interface and to the output of the third substage and suitable for delivering the two output signals. The third substage is then, for example, suitable for performing subtractions of the signals delivered by the second substage.

According to another variant of the invention, the processing means include a first substage suitable for performing the phase for frequency division by p, a second substage suitable for performing the phase for frequency multiplication by q, frequency transposition means connected to said input interface and to the output of the second substage, and a third substage suitable for performing the phase for elimination of the even harmonics from the signals derived from the transposition means so as to deliver the two output signals. The third substage is then advantageously suitable for performing subtractions of the signals delivered by the frequency transposition means so as to generate the two output signals.

In one or other of these variants, the first substage and the second substage advantageously include joint logic means suitable for performing both logical signal combinations and q-1 signal offsets by multiples of the period or of the half-period of the basic signal, each multiple of said period or of said half-period being equal to the product of said period or of said half-period and an integer coefficient taken from the group of integers closest to R or 2R, respectively.

According to an embodiment, the first substage includes a succession of frequency dividers by 2 or a modulo p counter, having an input to receive the basic signal and outputs suitable for generating a succession of primary signals to the joint logic means, and the joint logic means are suitable for performing logical combinations of these primary signals with each other and, where appropriate, with the basic signal. The joint logic means include, for example, AND logic gates with some of their inputs inverting.

According to another embodiment, the first substage and the second substage include joint logic means suitable for performing both the frequency division by p and q-1 signal offsets by multiples of the period or of the half-period of the basic signal, each multiple of said period or of said half-period being equal to the product of said period or of said half-period and an integer coefficient taken from the group of the integers closest to R or 2R, respectively. The joint logic means then include, for example, a p-stage ring counter having an input to receive the basic signal.

According to an embodiment, the second substage includes summation means connected to the output of the joint logic means and suitable for delivering two pairs of tertiary periodic signals each having the frequency $F_C$. The summation means include, for example, two pairs of OR logic gates connected to the outputs of the joint logic means.

According to an embodiment, the joint logic means are suitable for generating two pairs of groups of q signals, each having a frequency $F_S$ equal to $F_C/q$, each group comprising a secondary periodic signal and the q-1 signals offset relative to this secondary periodic signal by said multiples of the period or of the half-period of the basic signal, the q signals of a group of each pair being respectively in phase opposition relative to the q peer signals of the other group of said pair, and in phase quadrature relative to the q signals of the peer group of the other pair.

The joint logic means then include, for example, two pairs of groups of q AND logic gates with some of their inputs inverting and are suitable for generating the two pairs of groups of q signals, and the summation means include, for example, two pairs of OR logic gates respectively connected to the two pairs of groups of q AND logic gates. The third substage then includes, for example, two subtractors respectively connected to the two pairs of OR gates.

To resolve the problem of the additional pulling source, the first stage preferably includes means suitable for delivering signals having pulses of width equal to twice the half-period or the period of the basic signal. Such means suitable for delivering signals having pulses of width equal to twice the half-period or the period of the basic signal avantageously comprise the p-stage ring counter.

According to another variant of the invention, the processing means include a preprocessing stage including a first block suitable for performing a frequency division by p with elimination of the even harmonics, a second block suitable for performing a frequency multiplication by q and frequency transposition means connected to the output of the preprocessing stage and to said input interface.

According to an embodiment of the invention, the first block is suitable for receiving the basic signal and for delivering two periodic intermediate signals in phase quadrature, each having a frequency $F_S$ equal to $F_C/q$ and odd frequency harmonics, and the second block is suitable for performing a frequency multiplication by q of the two intermediate signals.

According to an embodiment of the invention, the first block comprises: a succession of frequency dividers by 2 or a modulo p counter having an input to receive the basic signal and outputs suitable for generating a succession of primary signals; a logic suitable for performing logical combinations of these primary signals with each other and, where appropriate, with the basic signal so as to generate two pairs of secondary periodic signals each having the frequency $F_S$, the two secondary signals of each pair being in phase quadrature and the two pairs themselves also being in phase quadrature; and subtraction means suitable for performing subtractions of these secondary signals so as to generate the two intermediate signals.

According to an embodiment of the invention, in which the pair of intermediate signals comprises a first intermediate signal and a second intermediate signal in phase quadrature relative to the first, the second block comprises: offset means suitable for performing q-1 successive offsets of the pair of intermediate signals by multiples of the period or of the half-period of the basic signal so as to obtain q-1 pairs of offset signals, each pair of offset signals comprising a first offset signal and a second offset signal in phase quadrature relative to the first, each multiple of said period or of said half-period being equal to the product of said period or of said half-period and an integer coefficient taken from the group of integers closest to R or 2R, respectively; an adder suitable for summing the first intermediate signal and the q-1 first offset signals; and an adder suitable for summing the second intermediate signal and the q-1 second offset signals According to an embodiment of the invention in which the basic signal preprocessing stage is suitable for delivering a first preprocessed signal and a second preprocessed signal in phase quadrature relative to the first preprocessed signal, the processing means also include a post-processing stage for the two preprocessed signals connected between the output of the preprocessing stage and the frequency transposition means and including: an additional offset means suitable for performing an offset of these two preprocessed signals by the period or the half-period of the basic signal so as to obtain a first offset preprocessed signal and a second offset preprocessed signal in phase quadrature relative to the first offset preprocessed signal; an adder suitable for summing the first preprocessed signal and the first offset preprocessed signal; and an adder suitable for summing the second preprocessed signal and the second offset preprocessed signal, so as to obtain the two transposition signals.

Another aspect of the invention is directed to a terminal of a wireless communication system, for example a cellular mobile telephone, incorporating a device as defined above.

BRIEF DESCRIPTION OF THE DRAWINGS

Other advantages and features of the invention will become apparent from examining the detailed description of non-limiting embodiments and implementations, and the appended drawings, in which.

DETAILED DESCRIPTION OF THE PREFERRED EMBODIMENTS

Figure 1:
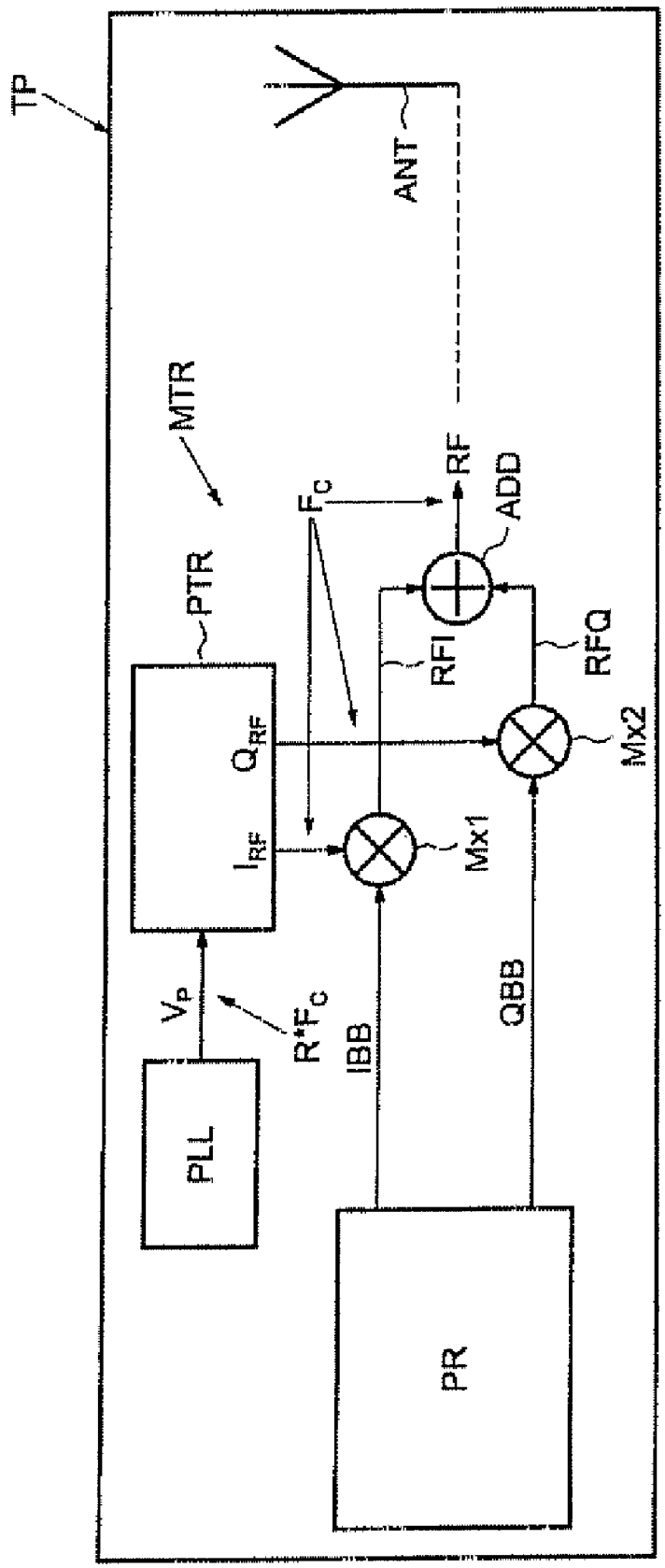
FIG. 1 is a schematic diagram illustrating an embodiment of a cellular mobile telephone incorporating an embodiment of a device according to the invention.

Referring initially to FIG. 1, the reference TP denotes a cellular mobile telephone that is part of a wireless communication system, for example a GSM system, or even CDMA system, although the invention is not limited to this type of system. The telephone TP conventionally includes a transmission subsystem that conventionally and in a manner known per se includes a processor PR performing baseband processes and delivering two initial baseband signals IBB and QBB, these two signals being in phase quadrature. According to a standard designation used by those skilled in the art, the signal IBB is called "in phase" signal whereas the signal QBB is called "in phase quadrature" signal.

The architecture described here is a direct conversion architecture, that is, the two baseband signals IBB and QBB are directly transposed to the desired radiofrequency $F_C$, within a frequency transposition unit or means, in this case formed by two mixers MX1 and MX2. These two mixers respectively receive two transposition signals $I_{RF}$ and $Q_{RF}$, mutually in phase quadrature, and having, as will be seen below, a dominant harmonic at the transposition frequency $F_C$. The two transposed signals or output signals RFI and RFQ are then summed in an adder ADD to provide a resultant signal RF which, after various conventional processes, will be transmitted via the antenna ANT of the telephone.

The device for generating the two transposition signals $I_{RF}$ and $Q_{RF}$, also called "generation device output signals", includes a device or means PLL for generating a periodic basic signal $V_P$, having a frequency $F_{OSC}$ equal to the product of the frequency $F_C$ and a non-integer rational number R, and processing circuit or means MTR which here incorporate a preprocessing stage PTR and the frequency transposition means MX1 and MX2.

The device or means for generating the basic signal $V_P$ are, for example, implemented by a phase-locked loop PLL of conventional structure and including a voltage-controlled oscillator delivering the basic signal $V_P$. The rational number R is equal to the ratio p/q of two integers p and q, p being chosen to be a multiple of 4 and q being chosen to be odd. Moreover, p is chosen to be greater than q and not a multiple of q so that the rational number R is a number greater than 1 and not an integer.

As an example, for a frequency $F_C$ equal to 2 GHz, it is possible to choose p to be equal to 16 and q to be equal to 3, which consequently leads to a frequency $F_{OSC}$ of the basic signal $V_P$ equal to 10.667 GHz. For one and the same frequency $F_C$ equal to 2 GHz, the choice of p and q respectively equal to 8 and 3 leads to a basic signal frequency $F_{OSC}$ equal to 5.333 GHz.

Figure 2:
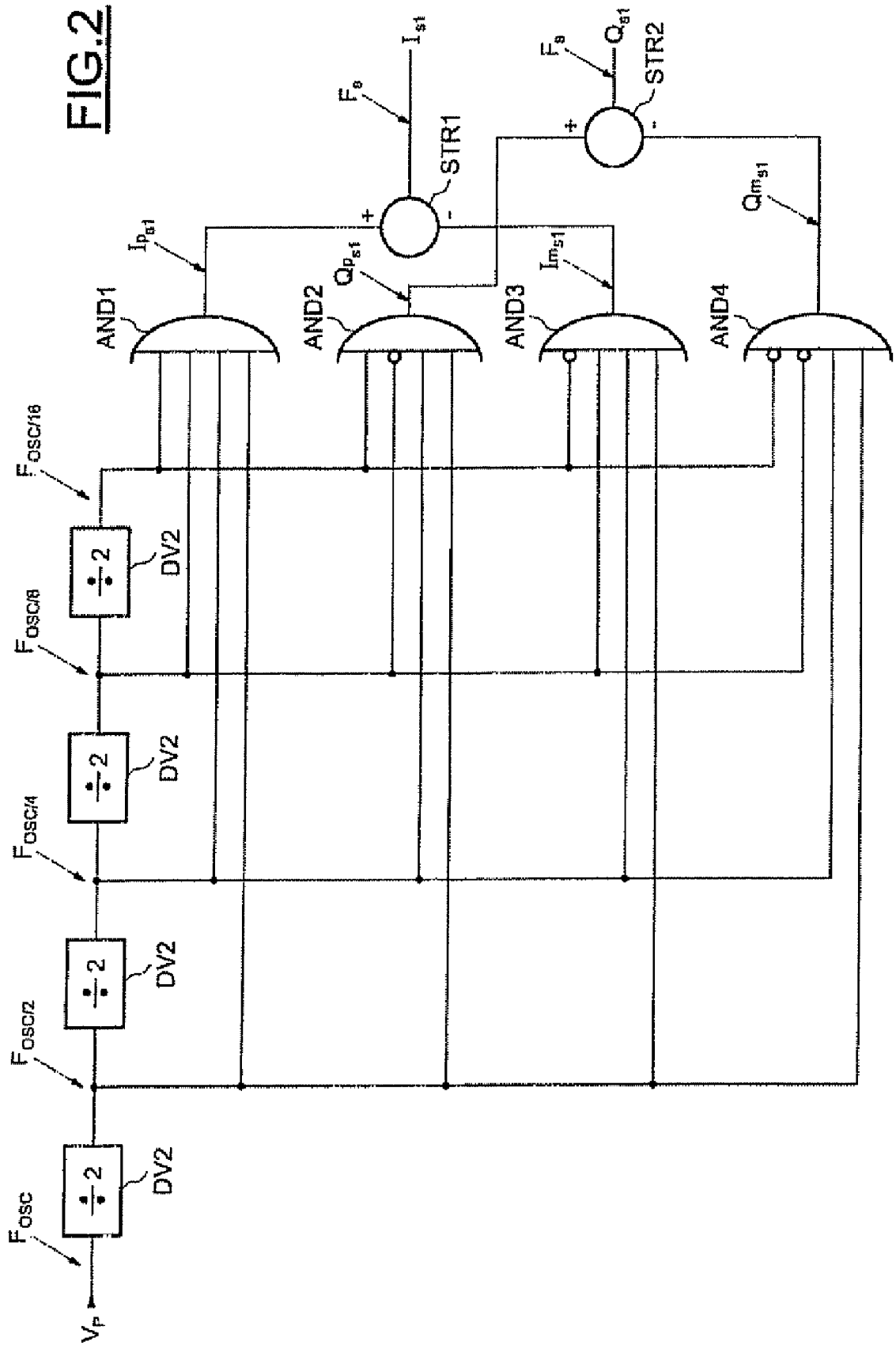
FIG. 2 is a schematic diagram illustrating a part of an embodiment of a device according to the invention.
Figure 3:
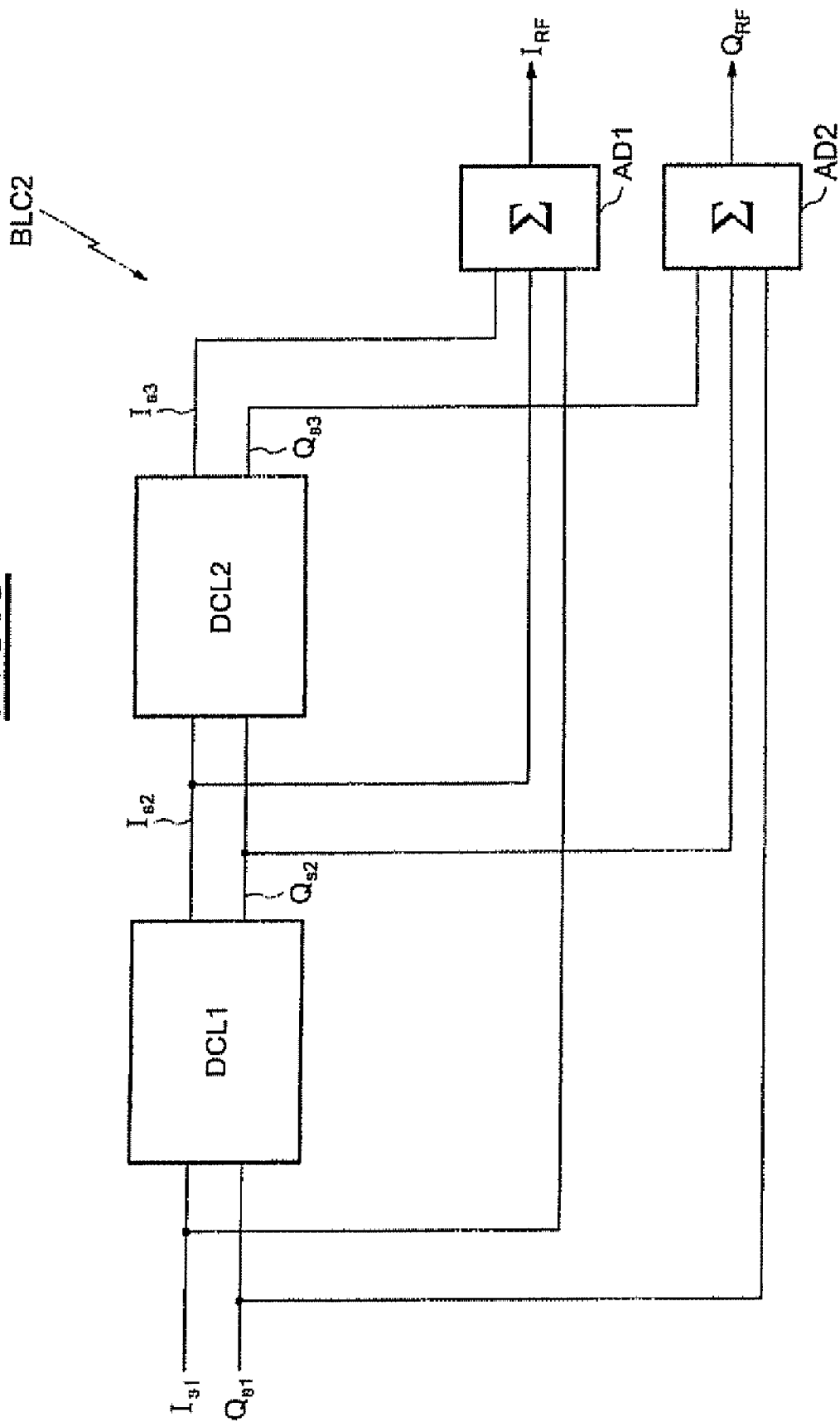
FIG. 3 is a schematic diagram illustrating another part of an embodiment of a device according to the invention.

There now follows a description, referring more particularly to FIGS. 2 and 3, of an exemplary structure of the processing circuit or means MTR, readily compatible with a digital CMOS technology. More specifically, the processing circuit or means MTR comprise at least the preprocessing stage including a first block BLC1, an exemplary implementation of which is illustrated in FIG. 2, and a second block BLC2, an exemplary implementation of which is illustrated in FIG. 3.

The first block BLC1 is suitable for performing a frequency division by p of the basic signal $V_P$ with elimination of the even harmonicas illustrated in FIG. 2, this block BLC1 receives the basic signal $V_P$ having the frequency $F_{OSC}$, and delivers two periodic intermediate signals $I_{S1}$ and $Q_{S1}$, these two signals being in phase quadrature and each having a frequency $F_S$ equal to $F_C/q$ and odd frequency harmonics. To perform this operation, the first block BLC1, in the example described, comprises a succession of dividers by 2, referenced DV2, suitable for performing a succession of divisions of the basic signal so as to generate a succession of primary signals.

In the example described here, with p=16, four dividers by 2 are used, respectively delivering four periodic primary signals respectively having the frequencies $F_{OSC}/2$, $F_{OSC}/4$, $F_{OSC}/8$ and $F_{OSC}/16$. The block BLC1 also comprises a logic formed here by four AND logic gates referenced AND1-AND4, of which certain inputs of certain gates are inverted.

Figure 4:
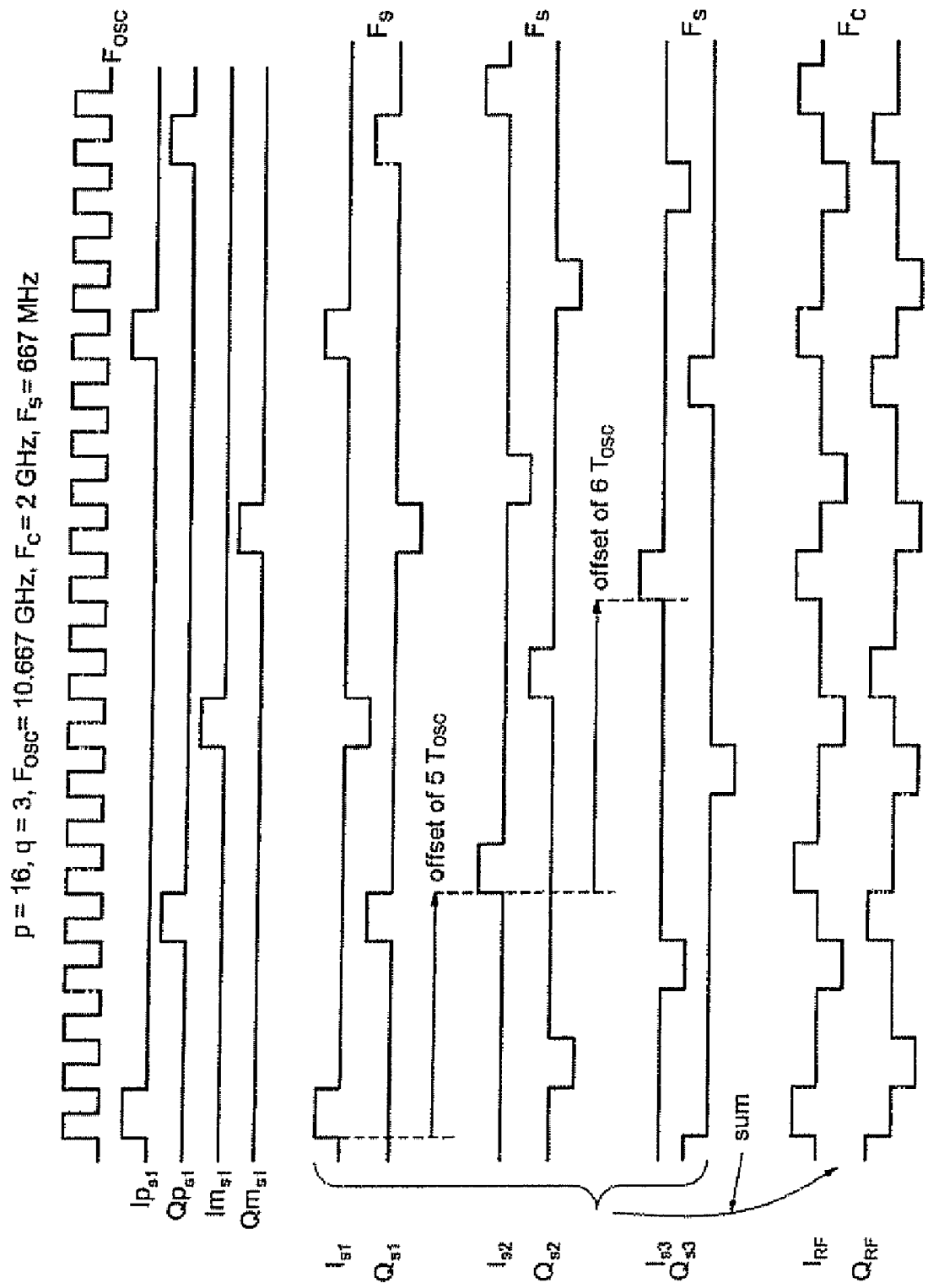
FIGS. 4 to 7 are schematic signal diagrams illustrating an embodiment of a method according to the invention.

Because of this, now referring more particularly to FIG. 4, it can be seen that the logic gate AND1 delivers as output the secondary periodic signal $Ip_{S1}$. The logic gate AND2, having its second input inverted, delivers the secondary periodic signal $Qp_{S1}$. The logic gate AND3, having its first input inverted, delivers the secondary periodic signal $Im_{S1}$ and the logic gate AND4, having its first two inputs inverted, delivers the secondary periodic signal $Qm_{S1}$.

Each of these secondary periodic signals is periodic with a period $T_S$ and a frequency $F_S$ equal to $F_C/q$, equal in the present case to 667 MHz since q is equal to 3. A first pair of these secondary periodic signals is formed by the signals $Ip_{S1}$ and $Qp_{S1}$ and the second pair of these secondary signals is formed by the signals $Im_{S1}$ and $Qm_{S1}$. The two secondary signals of each pair are in phase quadrature and the two pairs are also themselves in phase quadrature. It can be seen in this example that a logical combination of the outputs of the four dividers DV2 has consequently been performed.

The block BLC1 moreover comprises subtractors or subtraction means STR1 and STR2 suitable for performing subtractions of these secondary signals so as to generate the two intermediate signals $I_{S1}$ and $Q_{S1}$. More specifically, the subtractor STR1 is linked to the output of the logic gates AND1 and AND3, whereas the subtractor STR2 is linked to the output of the logic gates AND2 and AND4. It can therefore be seen in FIG. 4 that the intermediate signals $I_{S1}$ and $Q_{S1}$ are periodic signals of frequency $F_S$ (period Ts) and include only odd frequency harmonics. These two intermediate signals $I_{S1}$ and $Q_{S1}$ are, moreover, in phase quadrature relative to each other.

The block BLC2, an exemplary embodiment of which is illustrated in FIG. 3, will perform a frequency multiplication by q of the two intermediate signals $I_{S1}$ and $Q_{S1}$. In this embodiment, the block BLC2 comprises offset means DLC1 and DLC2 suitable for performing q-1 (in this case two) successive offsets of the pair of intermediate signals $I_{S1}$ and $Q_{S1}$ by multiples of the period $T_{OSC}$ of the basic signal so as to obtain q-1 pairs of offset signals. Physically, the two offset circuits DCL1 and DCL2 are, for example, implemented with delay means clocked by the basic signal $V_P$ having as its period $T_{OSC}$.

Moreover, each multiple of the period of the basic signal is equal to the product of said period and an integer coefficient taken from the group of integers closest to R. In the present case, R is equal to 16/3. Consequently, the integers closest to R are 5 and 6. Therefore, as an example, and as illustrated in FIG. 4, the signals $I_{S1}$ and $Q_{S1}$ are respectively offset by five times the period $T_{OSC}$ so as to give two offset signals $I_{S2}$ and $Q_{S2}$. Furthermore, the signal $I_{S2}$ and the signal $Q_{S2}$ are themselves in turn offset, for example, by six times the period $T_{OSC}$, so as to obtain two offset signals $I_{S3}$ and $Q_{S3}$.

The three mutually offset signals $I_{S1}$, $I_{S2}$ and $I_{S3}$ are summed in a first adder AD1 so as to deliver the output signal in phase $I_{RF}$ (in-phase transposition signal). Similarly, the three offset signals, but this time in phase quadrature, $Q_{S1}$, $Q_{S2}$ and $Q_{S3}$, are summed in a second adder AD2 so as to form the transposition signal $Q_{RF}$ in phase quadrature relative to the signal $I_{RF}$.

Figure 5:
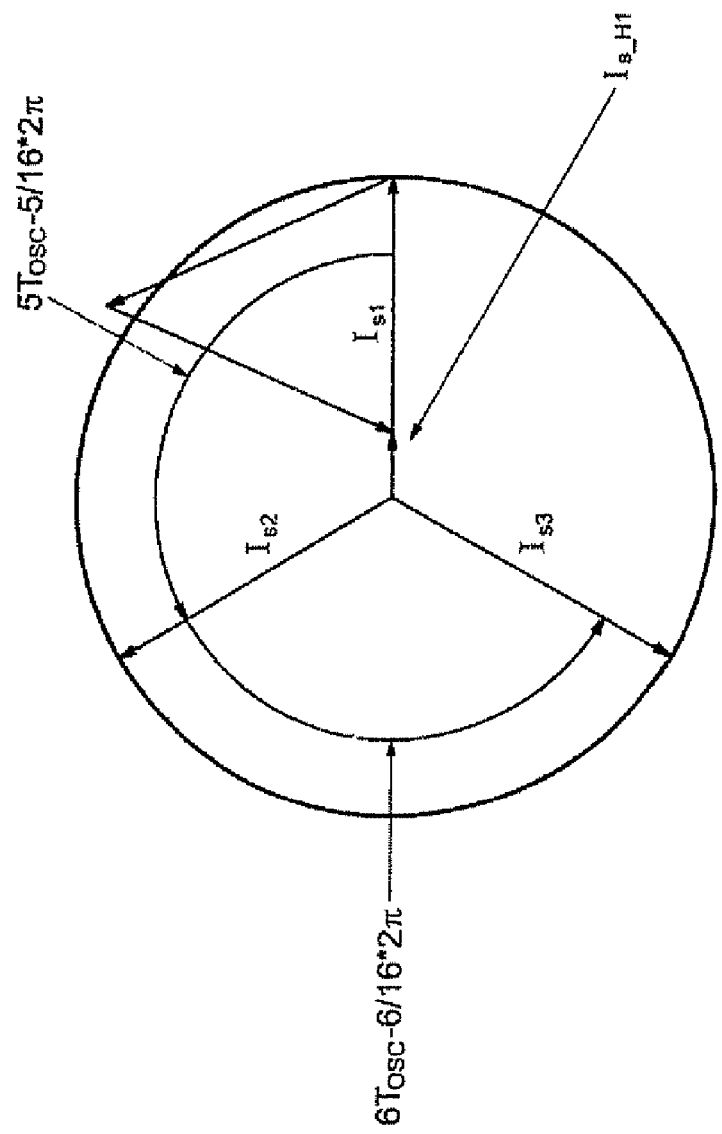

It can be seen from FIG. 5 that the sum of the offsets between the signal $I_{S1}$ and $I_{S2}$, between the signal $I_{S2}$ and $I_{S3}$, and between the signal $I_{S3}$ and $I_{S1}$ is equal to p (16, in this case). The transposition signals obtained $I_{RF}$ and $Q_{RF}$ are in this case periodic signals of period $qT_C$. As illustrated in FIG. 5, they present a low primary harmonic (or 1st order harmonic) $I_{S-H1}$ (of frequency Fc/q).

Figure 6:
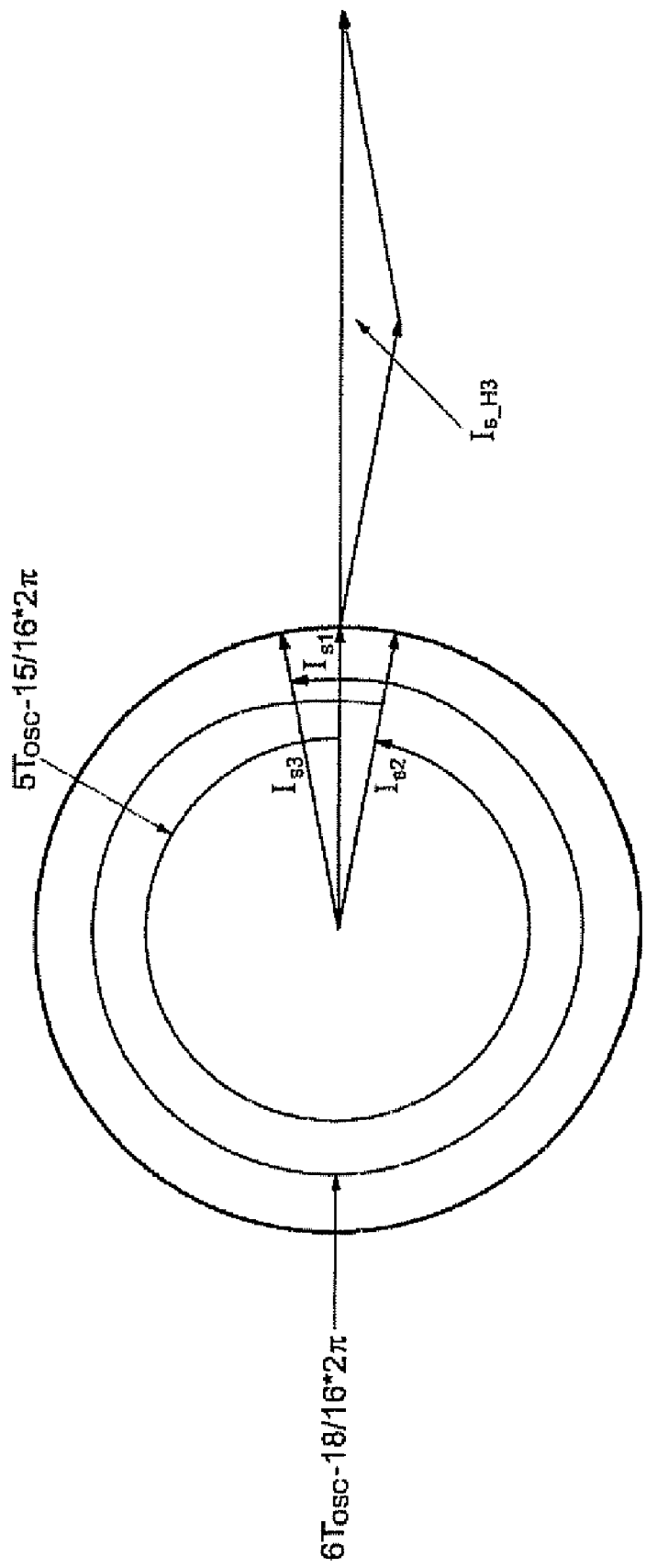
Figure 7:
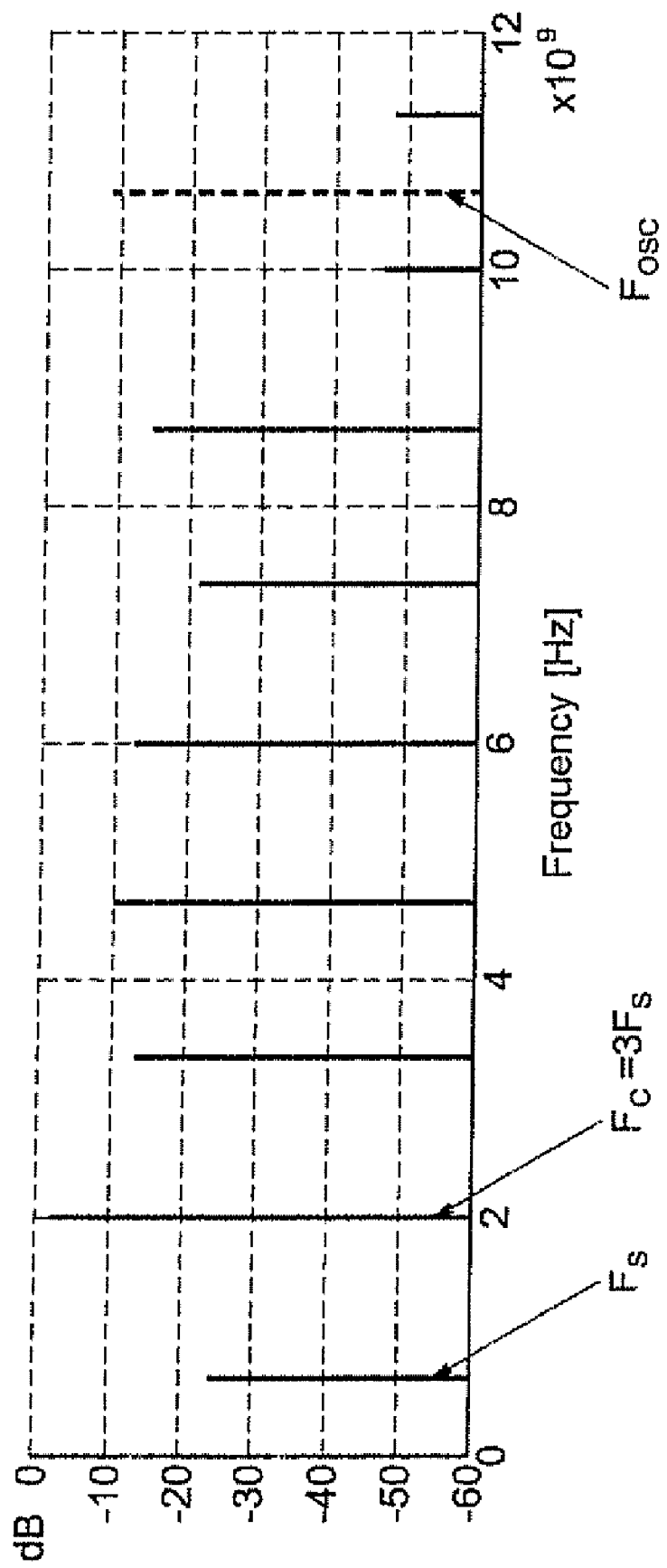

Moreover, the even harmonics are zero and these signals include only odd harmonics with the qth order harmonic strengthened or dominant. This qth order harmonic, in this case 3rd order, has the frequency $F_C$. And, it can be seen from FIG. 6 that this harmonic $I_{S-H3}$ is effectively dominant. In this case, it can be seen, as illustrated in FIG. 7, that the 3rd order harmonic, corresponding to the frequency $F_C$ of 2 GHz, is strengthened whereas the 1st order harmonic having the frequency $F_S$ is considerably diminished. Moreover, the frequency $F_{OSC}$ of the basic signal is placed between two high harmonics of $F_S$, in this case between the 15th and 17th order harmonics.

There is therefore no pulling source. It should be noted here that the harmonics other than the "qth" order harmonic can easily be suppressed by filtering. Moreover, in the exemplary embodiment that has just been described, the transposition frequency $F_C$ is obtained at the level of a qth order harmonic different from the primary harmonic or 1st order harmonic. That said, if other embodiments had been adopted for the frequency division by p and the frequency multiplication by q, for example using delay-locked loops, transposition signals having a primary order harmonic equal to $F_C$ would effectively have been obtained.

FIG. 7 illustrates another exemplary embodiment and implementation in which p is equal to 8 and q is equal to 3. Moreover, whereas in the example illustrated in FIGS. 2 to 7, only the rising edges of the basic signal $V_P$ (frequency $F_{OSC}$), and consequently only the outputs of the dividers DV2, were used, in the example of FIG. 8, both the rising edges and the falling edges of the basic signal are used. Because of this, the logic of the block BLC1 used to obtain the signals $Ip_{S1}$, $Qp_{S1}$, $Im_{S1}$ and $Qm_{S1}$, also uses a logical combination of the output of the dividers and of the basic signal. Moreover, in this case, it is also possible to perform an offset equal to an integer multiple of the half-period $T_{OSC}$ of the basic signal Thus, in the present case illustrated in FIG. 8, and since R is equal to 8/3, the two integers closest to 2R are 5 and 6.

Figure 9:
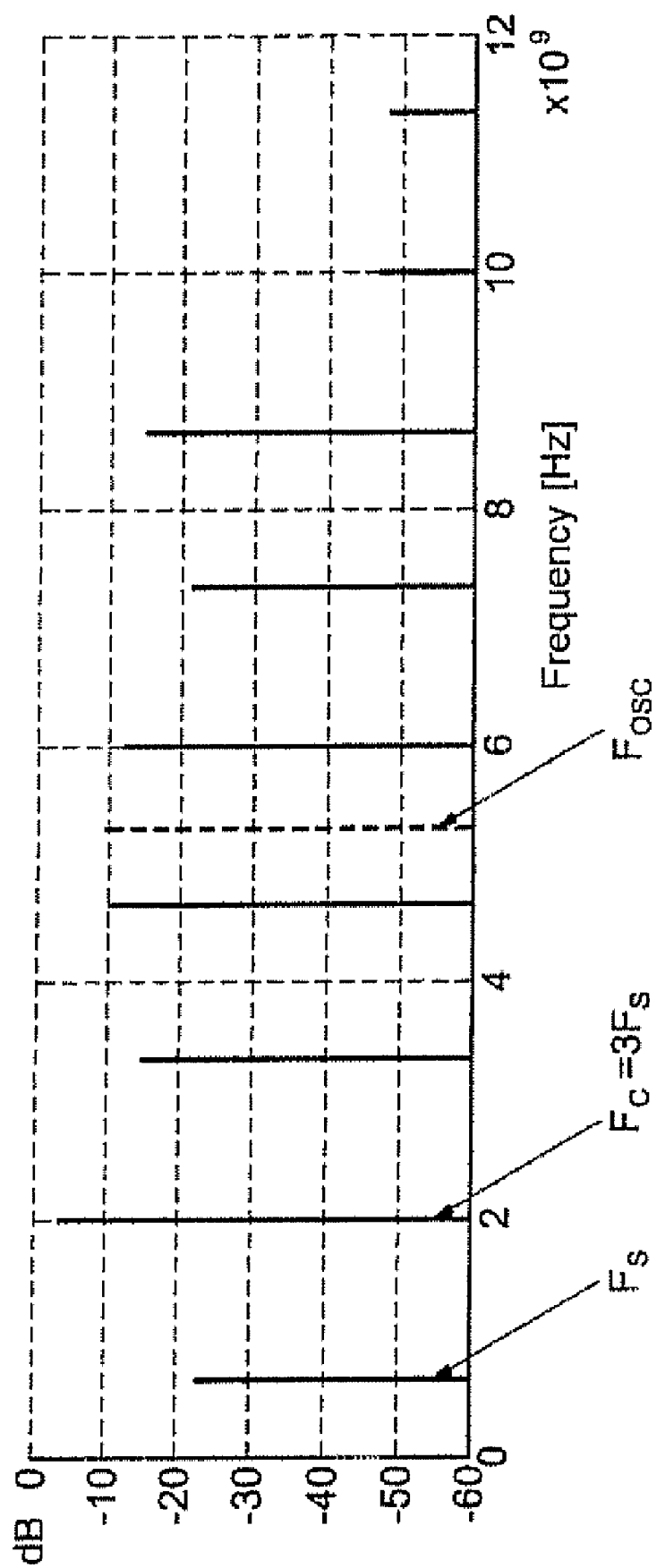

It will consequently be decided, for example, to offset the signals $I_{S2}$ and $Q_{S2}$ by five times the half-period of the basic signal and to offset the signals $I_{S3}$ and $Q_{S3}$ by six times the half-period of the basic signal. Here, too, as illustrated in FIG. 9, it can be seen that the third harmonic of the signals $I_{RF}$ and $Q_{RF}$, the frequency of which is equal to the wanted frequency $F_C$, is dominant whereas the 1st order harmonic, of frequency equal to $F_S$, is already virtually eliminated. Moreover, the frequency of the oscillator of the phase-locked loop $F_{OSC}$ is located between the seventh and the ninth harmonics of the frequency $F_S$.

It should be noted that, normally, the generation of orthogonal signals that use both the rising and falling edges of a clock signal (in this case the basic signal) leads to a mismatching in phase and in amplitude of the two orthogonal signals when the duty cycle of the clock signal is different from 50%, which leads to a degradation of the modulation quality. Now, this is not the case when a non-integer rational frequency division is used, in accordance with an aspect of the invention. In other words, the signals $I_{RF}$ and $Q_{RF}$ obtained remain orthogonal (in phase quadrature) even if the duty cycle is different from 50%.

Figure 10:
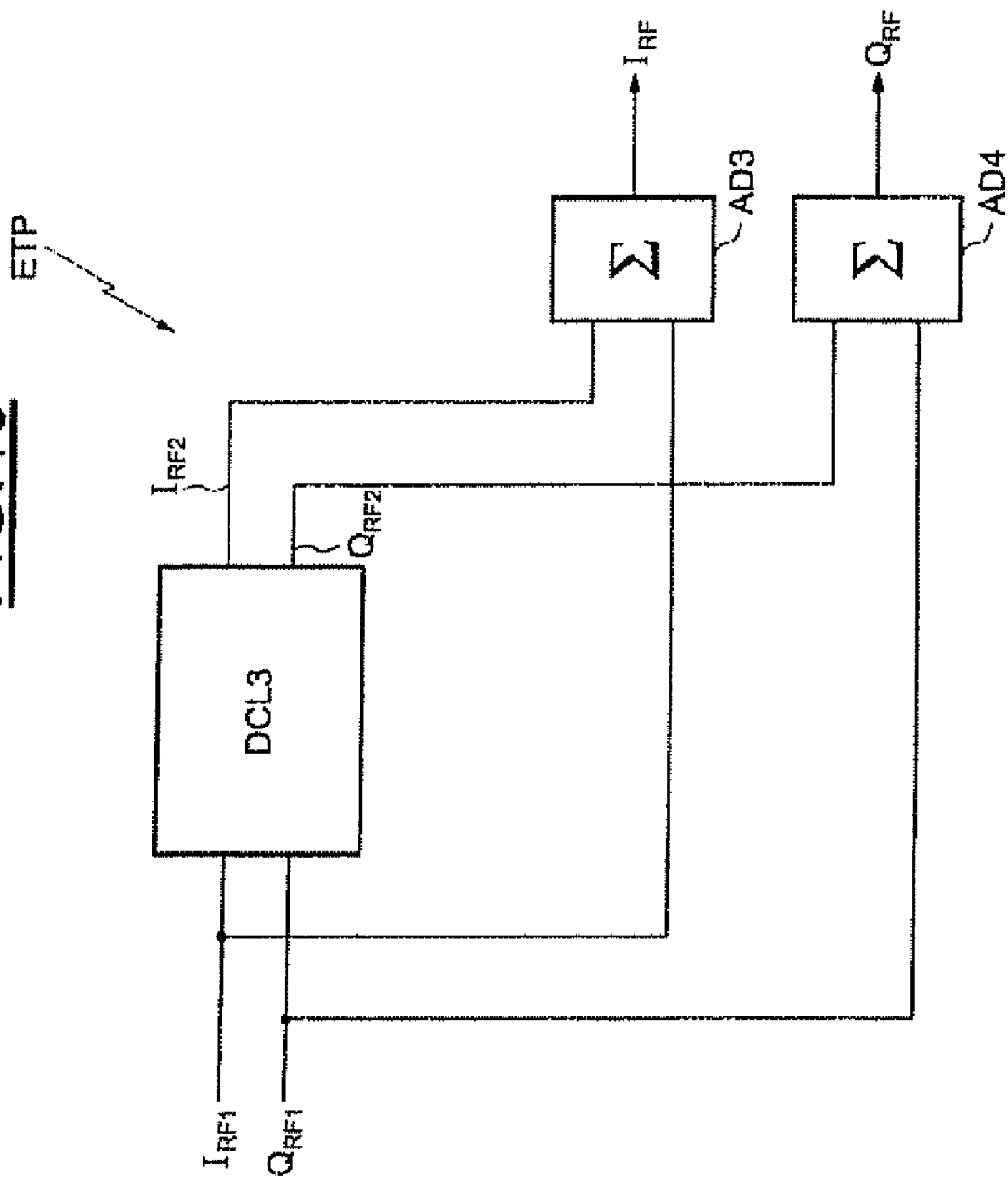
FIGS. 10 and 11 are a block diagram and signal diagram, respectively, schematically illustrating another embodiment of a device according to the invention enabling another method embodiment of the invention.

Besides the main pulling source which has just been eliminated, there can be an additional pulling source provoking even harmonics of $F_S$ and which result from spurious sums linked to current injections into the power supply or into ground. To resolve this additional problem, the invention, according to another aspect, provides for the processing circuit or means MTR also to include a post-processing stage ETP, an example of which is illustrated in FIG. 10. More specifically, if the signals $I_{RF1}$ and $Q_{RF1}$ are preprocessed signals derived from the block BLC2 of the preprocessing stage, the post-processing stage ETP then includes an additional offset means DCL3 suitable for performing an offset of these two signals by the period or the half-period of the basic signal so as to obtain a first offset preprocessed signal $I_{RF2}$ and a second offset preprocessed signal $Q_{RF2}$ in phase quadrature relative to the signal $I_{RF2}$.

An adder AD3 sums the signals $I_{RF1}$ and $I_{RF2}$ to deliver the output signal $I_{RF}$ (transposition signal). Moreover, another adder AD4 sums the signal $Q_{RF1}$ and the signal $Q_{RF2}$ so as to deliver the other output signal $Q_{RF}$ (transposition signal) in phase quadrature relative to the signal $I_{RF}$.

Figure 11:
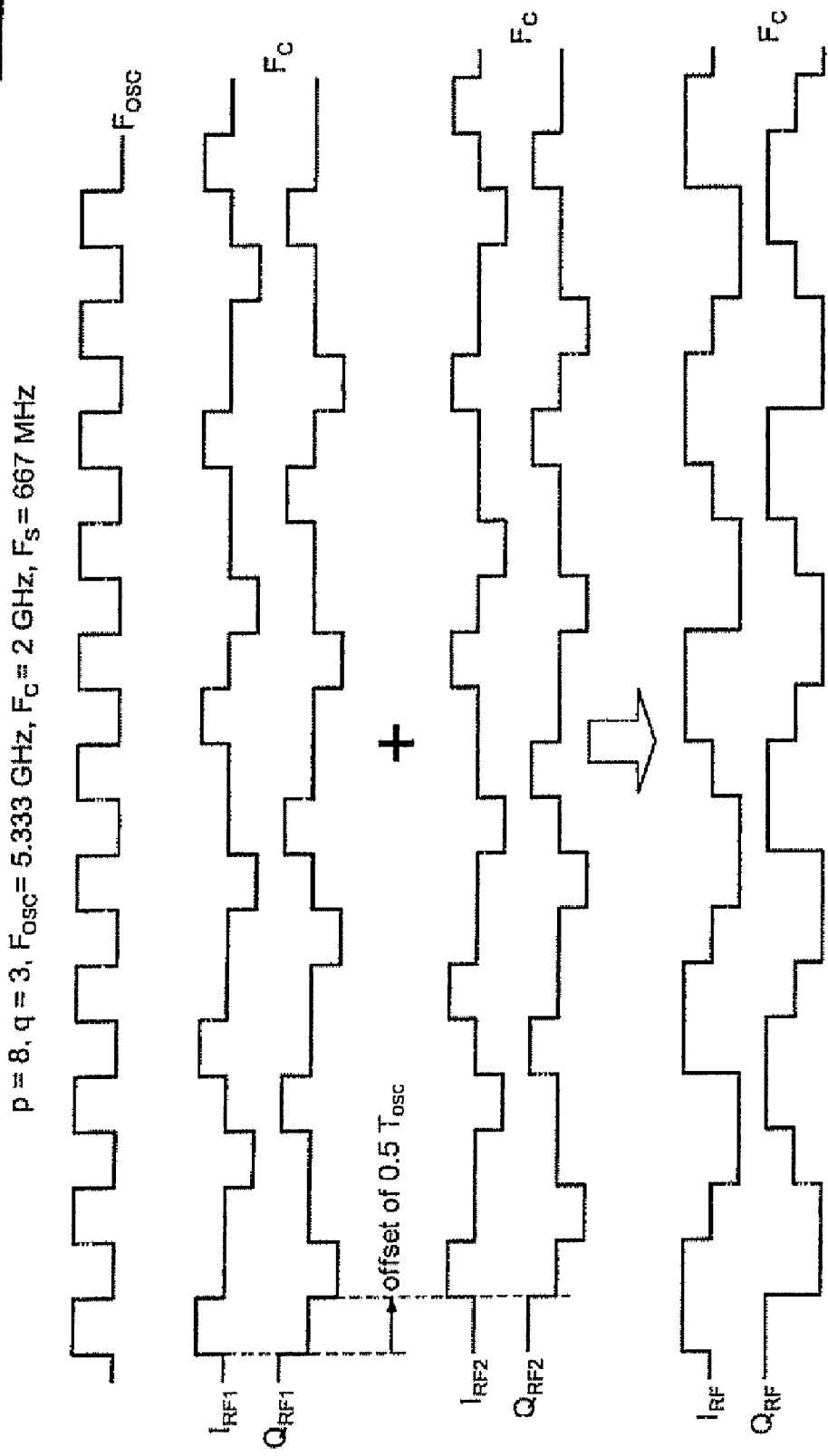

The operation of this post-processing stage ETP is illustrated in FIG. 11, for the case where p is equal to 8 and q is equal to 3 and for the case where both the rising and falling edges of the basic signal of frequency $F_{OSC}$ are used. The signals $I_{RF2}$ and $Q_{RF2}$ are then offset by a half-period $T_{OSC}$ relative to the signals $I_{RF1}$ and $Q_{RF1}$. If only the rising edges of the basic signal had been used, it would have been possible to proceed with an offset by a period $T_{OSC}$. Because of this, the even harmonics due to the spurious sum and which would coincide with the frequency $F_{OSC}$ are eliminated.

Figure 12:
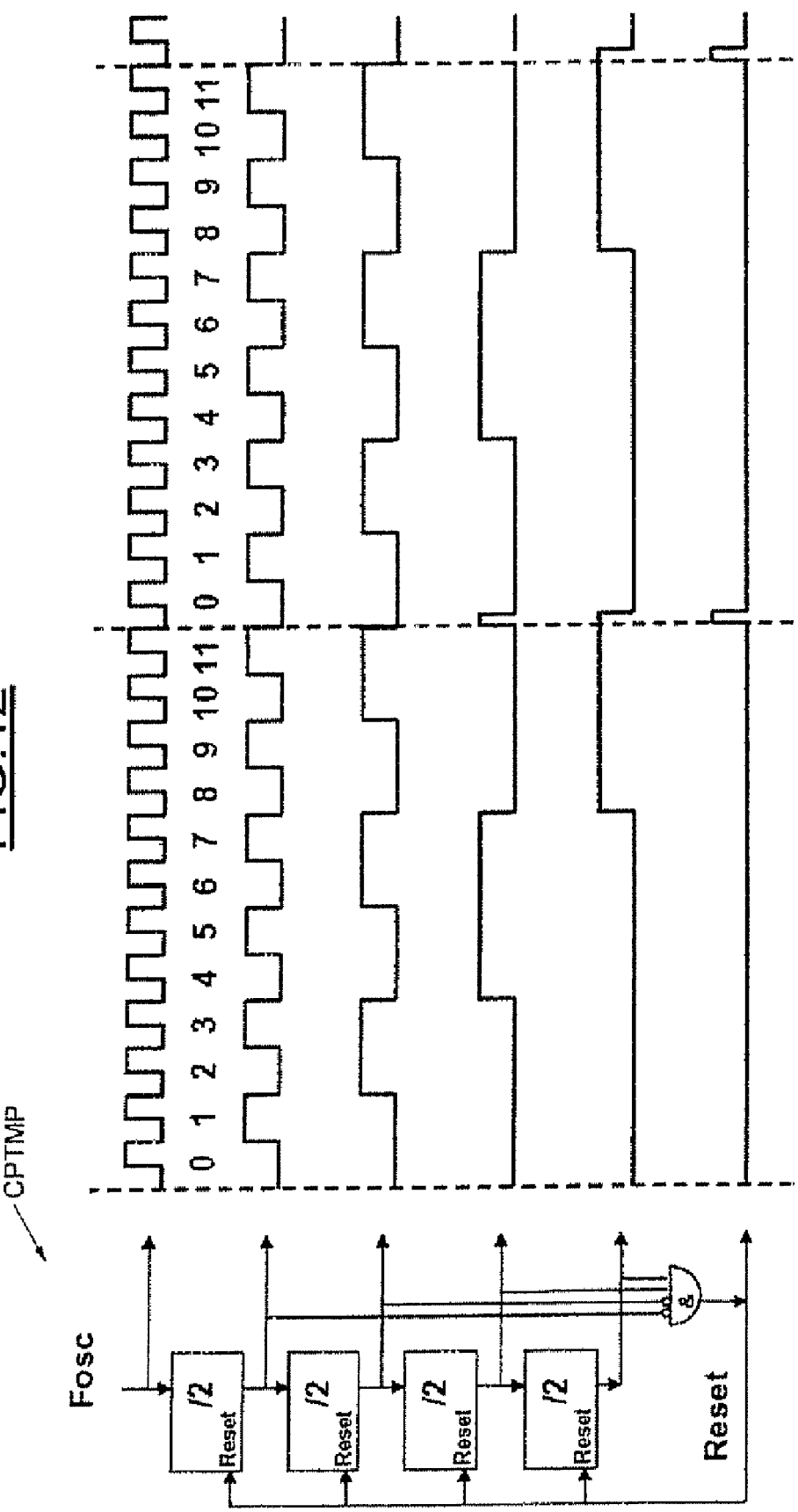
FIGS. 12 to 24 are various signal diagrams and circuit diagrams schematically illustrating yet further implementations and embodiments of the invention.

There now follows a description referring more particularly to FIG. 12 and following, of other embodiments and implementations of the invention. When p is a power of 2, a succession of frequency dividers by 2 DVD2 is advantageously used, as illustrated in FIG. 2. However, more generally, and in particular when p is not a power of 2, for example when p is equal to 12, a modulo p counter CPTMP is used, an embodiment of which is illustrated in FIG. 12 for the case where p is equal to 12.

The left-hand part of FIG. 12 schematically illustrates the internal structure of the counter CPTMP whereas the right-hand part of FIG. 12 illustrates the input, output and reset signals of the counter. More specifically, the modulo p counter CPTMP comprises four dividers by 2, each having a reset input, and an AND gate with, in this case, two inverting inputs. This AND gate detects when the counter arrives at the code 12 (1,1,0,0) and generates the reset signal which resets the dividers to zero. The four outputs of the four dividers by 2 of the counter CPTMP are then connected to the gates AND1-AND4 of FIG. 2 in the same way as are connected the outputs of the dividers DV2 in that FIG. 2.

Figure 13:
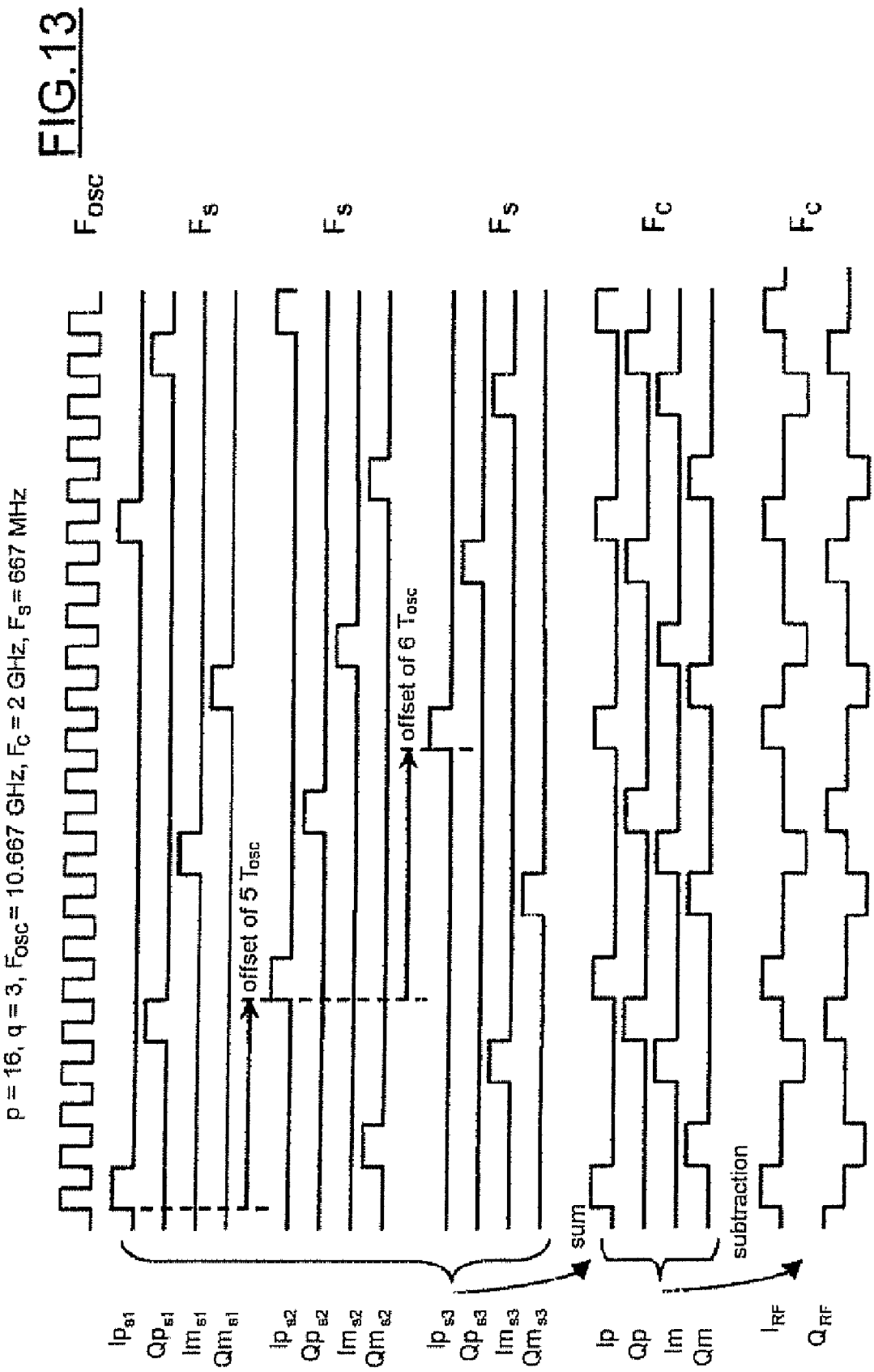
Figure 14:
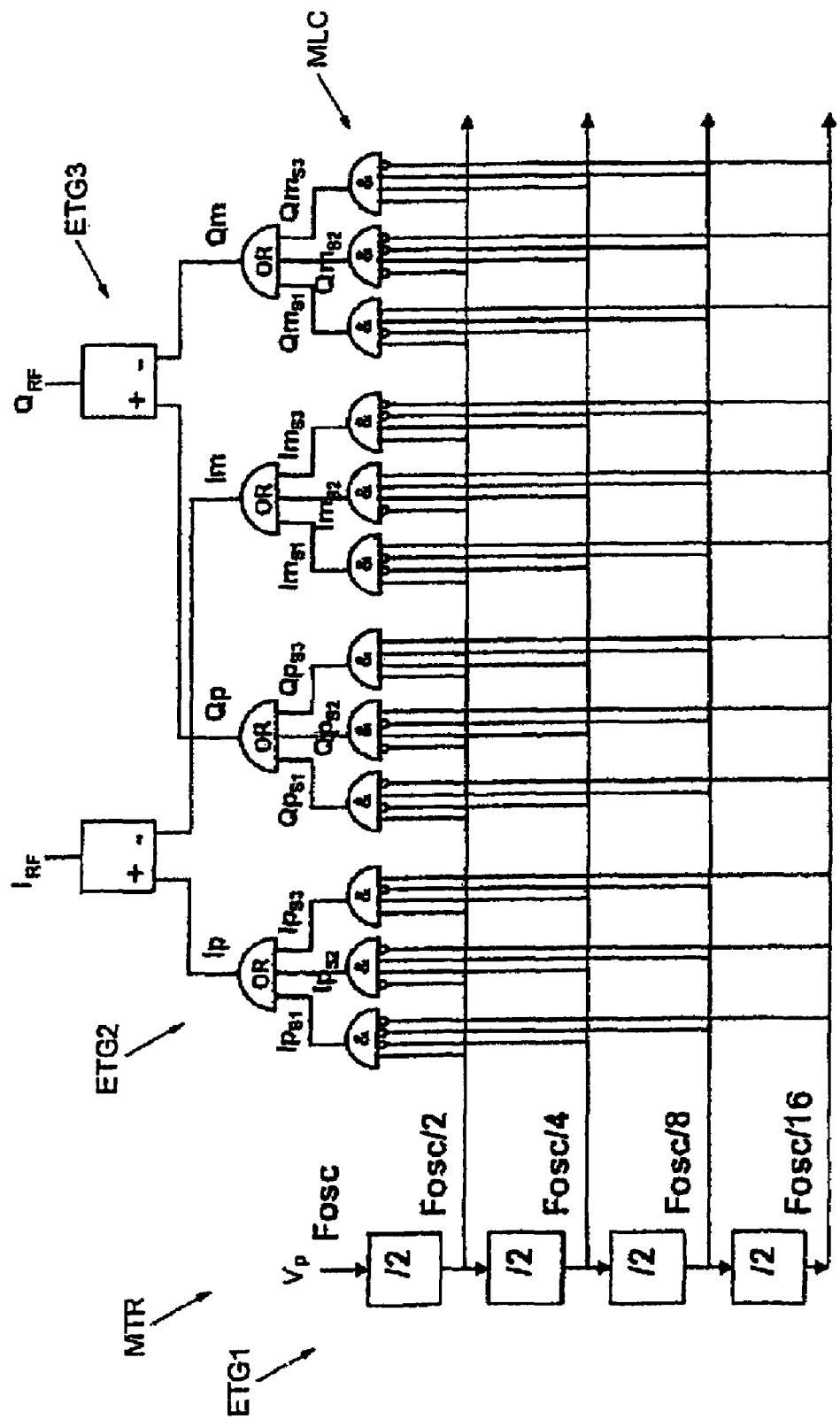

Whereas in the embodiment illustrated in FIGS. 2 to 4 in particular, a phase for frequency division by p is performed with elimination of the even harmonics followed by a frequency multiplication by q, it is also possible to perform, as illustrated more particularly in FIGS. 13 and 14, a phase for frequency division by p, the phase for frequency multiplication by q, and the phase for eliminating the even harmonics of the signals derived from the frequency multiplication.

And, as will now be seen, the frequency division phase and the frequency multiplication phase advantageously include joint operations performed at the same time and including logical combinations of signals and q-1 signal offsets by multiples of the period or of the half-period of the basic signal, each multiple of said period or of said half-period being equal to the product of said period or of said half-period and an integer coefficient taken from the group of the integers closest to R.

Thus, in the case illustrated in FIG. 13, the two integer coefficients are respectively equal to 5 and 6 (R=16/3), as in the case of FIG. 4. More specifically, as illustrated in FIG. 14, the processor or processing means MTR includes a first substage ETG1 having an input to receive the basic signal Vp and suitable for performing the phase for frequency division by p, a second substage ETG2 suitable for performing the phase for frequency multiplication by q, and a third substage ETG3 suitable for performing the phase for elimination of the even harmonics derived from signals from the second substage.

In the example of FIG. 14, the first substage ETG1 comprises a succession of frequency dividers by 2. As a variant, this succession of dividers by 2 could be replaced by a modulo p counter as illustrated in FIG. 12. The first substage ETG1 and the second substage ETG2 include joint logic means MLC comprising AND logic gates with some of their inputs inverting. More specifically, the joint logic means in this case comprise, for example, two pairs of groups of q(3) AND logic gates and are suitable for generating two pairs of groups of q signals, each having a frequency $F_S$ equal to $F_C/q$.

In the example illustrated in FIGS. 13 and 14, the first group of signals of a first pair comprises a secondary periodic signal $Ip_{S1}$ and the two offset signals $Ip_{S2}$ and $Ip_{S3}$ relative to the signal $Ip_{S1}$. The other group of three signals of said pair comprises the secondary periodic signal $Im_{S1}$ and the two offset signals $Im_{S2}$ and $Im_{S3}$. It can be seen that the signals $Ip_{Si}$ and $Im_{Si}$ are in phase opposition.

The other pair of groups of three signals includes the group of the three signals $Qp_{S1}$, $Qp_{S2}$ and $Qp_{S3}$, and, the group of the three signals $Qm_{S1}$, $Qm_{S2}$ and $Qm_{S3}$. Here, too, the signals $Qp_{Si}$ and $Qm_{Si}$ are in phase opposition. However, the signals $Ip_{Si}$ and $Qp_{Si}$ are in phase quadrature, like the signals $Im_{Si}$ and $Qm_{Si}$.

The second substage ETG2 comprises two pairs of OR logic gates, referenced OR in FIG. 14, respectively connected to the two pairs of groups of AND logic gates. These OR logic gates form summing means. The first pair of OR logic gates delivers a first pair of tertiary periodic signals Ip and Im. The second pair of OR logic gates delivers another pair of tertiary periodic signals Qp and Qm. Each of these tertiary periodic signals has the frequency Fc. Then, the third substage ETG3 eliminates the even harmonics of the tertiary periodic signals derived from the second substage ETG2. This third substage ETG3 is formed by two subtractors respectively connected to the two pairs of OR gates. The first subtractor delivers the transposition signal $I_{RF}$ and the other subtractor delivers the other transposition signal $Q_{RF}$.

The advantage of such an embodiment is that the generation of the signals and their "offset" images is accomplished in a single step by AND gates, whereas the sums are generated by OR gates and an analogue circuit handles the subtraction. Consequently, apart from the subtraction, all the operations are executed by logic gates, which is fully and readily compatible with a digital technology implementation.

Figure 15:
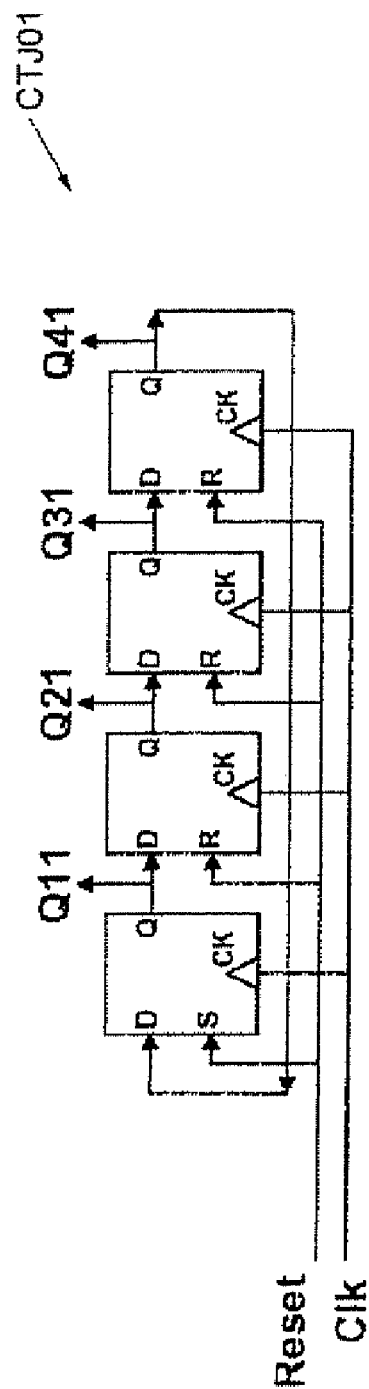
Figure 16:
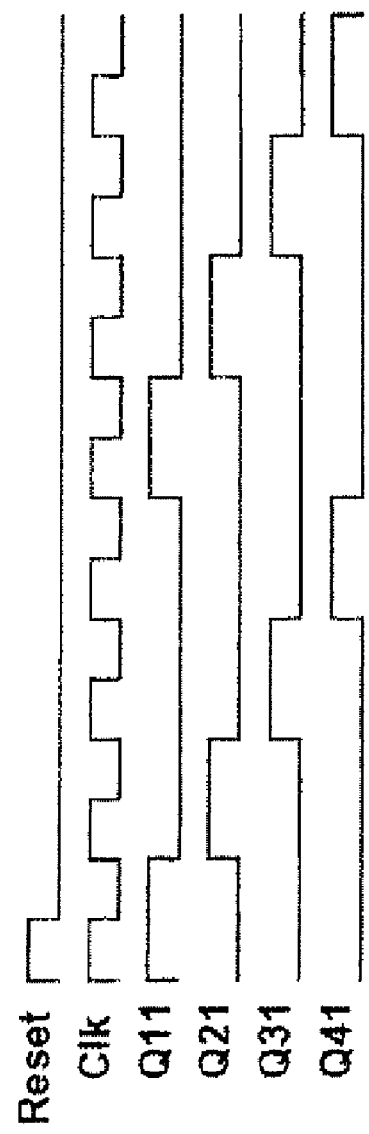

Another way of implementing the phase for frequency division by p consists in using a ring counter, or Johnson counter, using D-type flip-flops controlled by clock edges. An exemplary embodiment of a four-stage Johnson counter CTJO1 is illustrated in FIG. 15 and used to perform a frequency division by 4. The signal Clk is, in the application envisaged here, the basic signal Vp, that is, the output signal from the voltage-controlled oscillator. FIG. 16 illustrates the various input and output signals of the Johnson counter CTJO1.

Figure 17:
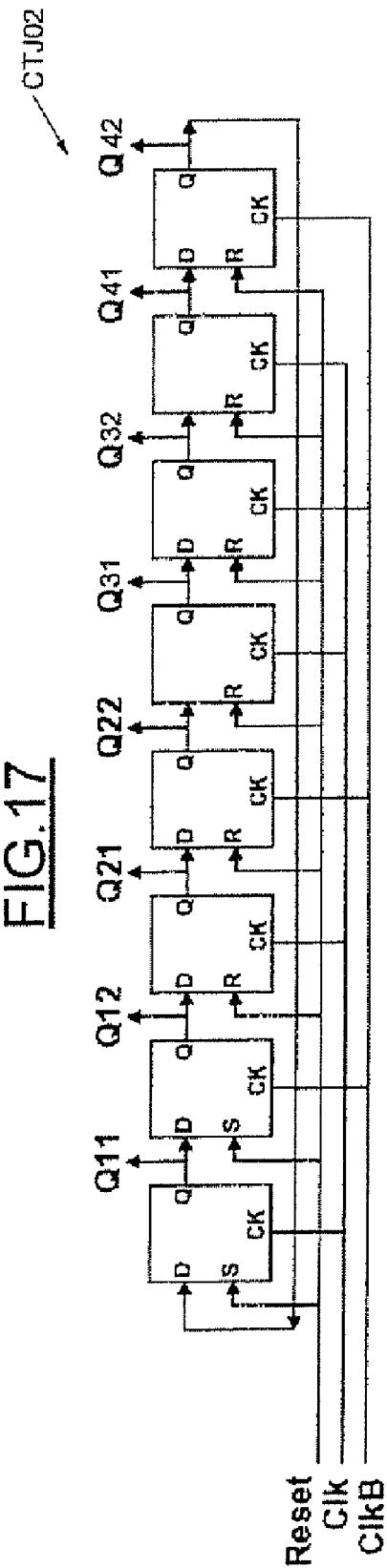
Figure 18:
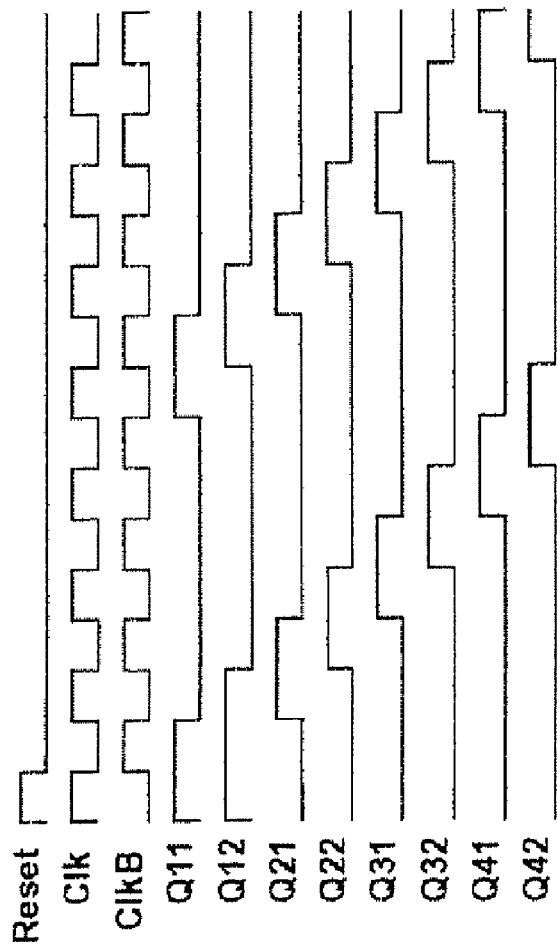

Another variant of a Johnson counter, also, for example, for performing a division by 4, is illustrated in FIG. 17. The Johnson counter CTJO2 here comprises not four stages but eight half-stages, which means that the signals can be offset by a half-period of the clock signal Clk, that is, the basic signal Vp. Moreover, the signal ClkB is the complementary signal of the clock signal Clk. FIG. 18 illustrates the form of the signals implemented in this Johnson counter CTJO2 with eight half-stages.

Figure 19:
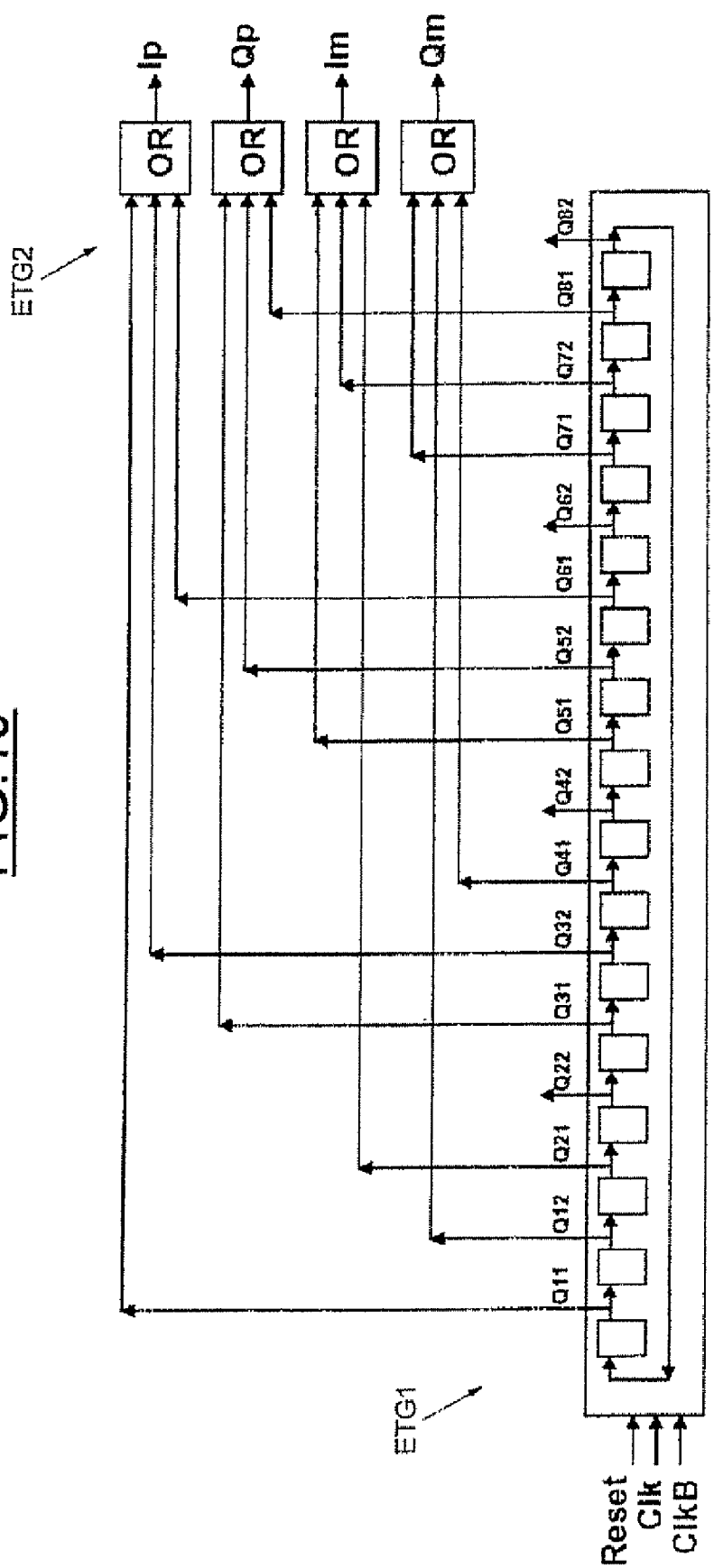

FIG. 19 illustrates another embodiment of the invention in which, this time, the first substage ETG1 and the second substage ETG2 comprise joint logic means suitable for performing both the frequency division by p and the q-1 signal offsets. These joint logic means are formed in this example by a ring counter (Johnson counter) with p stages or 2p half-stages.

Figure 20:
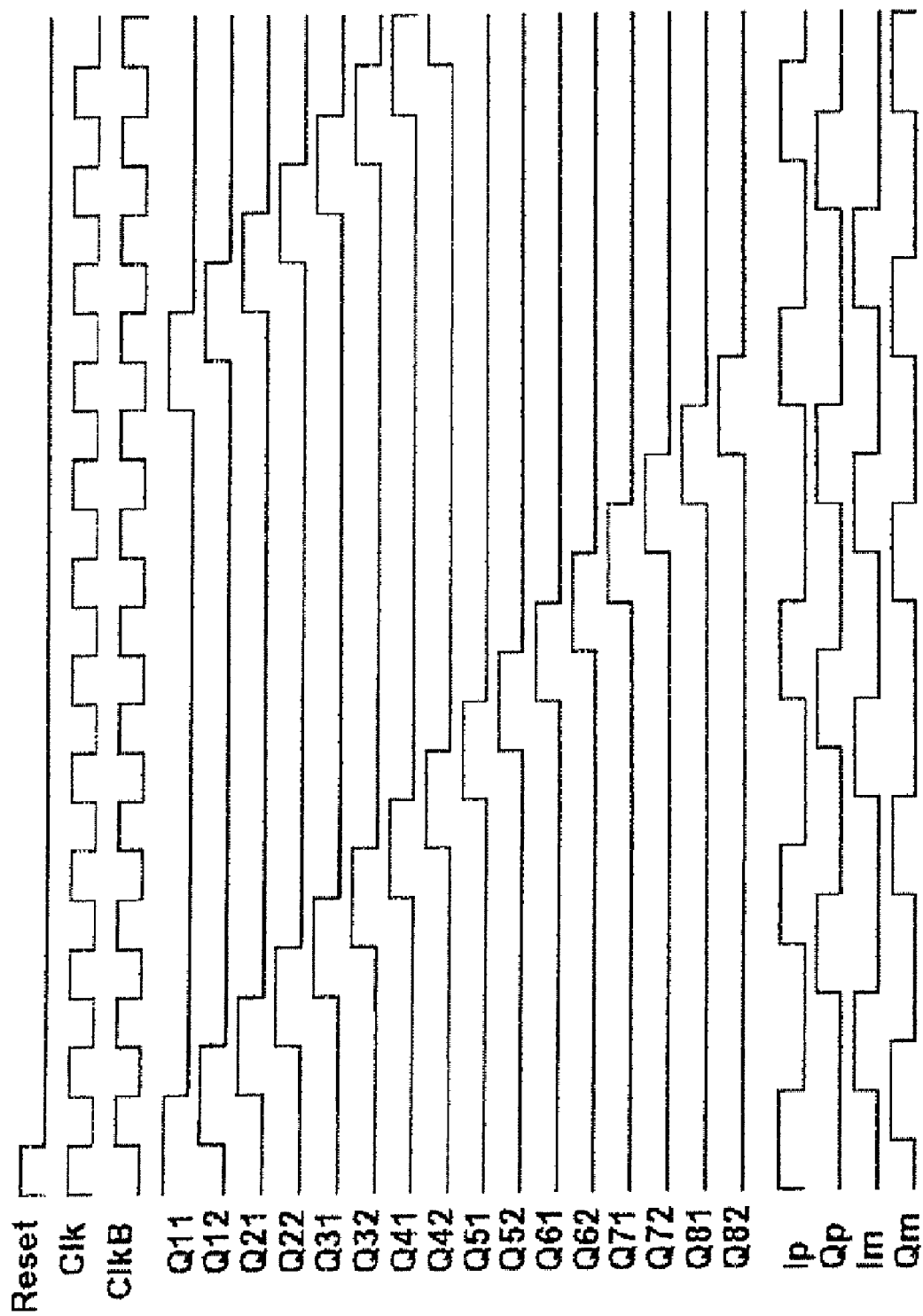

Thus, in the example illustrated in FIG. 19, used to perform a division by 8 and a multiplication by 3, the counter CTJO3 is a Johnson counter with eight stages or sixteen half-stages receiving as control signals the signal Clk, that is, the basic signal from the local oscillator, and the complementary signal ClkB. The second substage ETG2 comprises, in addition to the Johnson counter CTJO3 as joint means with the first substage ETG1, the four OR logic gates, referenced OR, in this case each having three inputs and linked to the different outputs of the stages or half-stages of the Johnson counter CTJO3. The OR logic gates deliver the signals Ip, Qp, Im and Qm. The form of these signals is illustrated in FIG. 20.

Compared to the embodiment illustrated in FIG. 14, this structure provides for operation at higher frequencies. Moreover, the path between the input (signals Clk and ClkB) and the outputs (signals Ip, Qp, Im and Qm) is shorter. Consequently, less phase noise is added to the signals delivered to the output. Of course, the signals Ip, Qp, Im and Qm are then delivered to the stage ETG3 such as the one illustrated in FIG. 14 for example, which performs a signal subtraction to remove the even harmonics from the signals.

Figure 21:
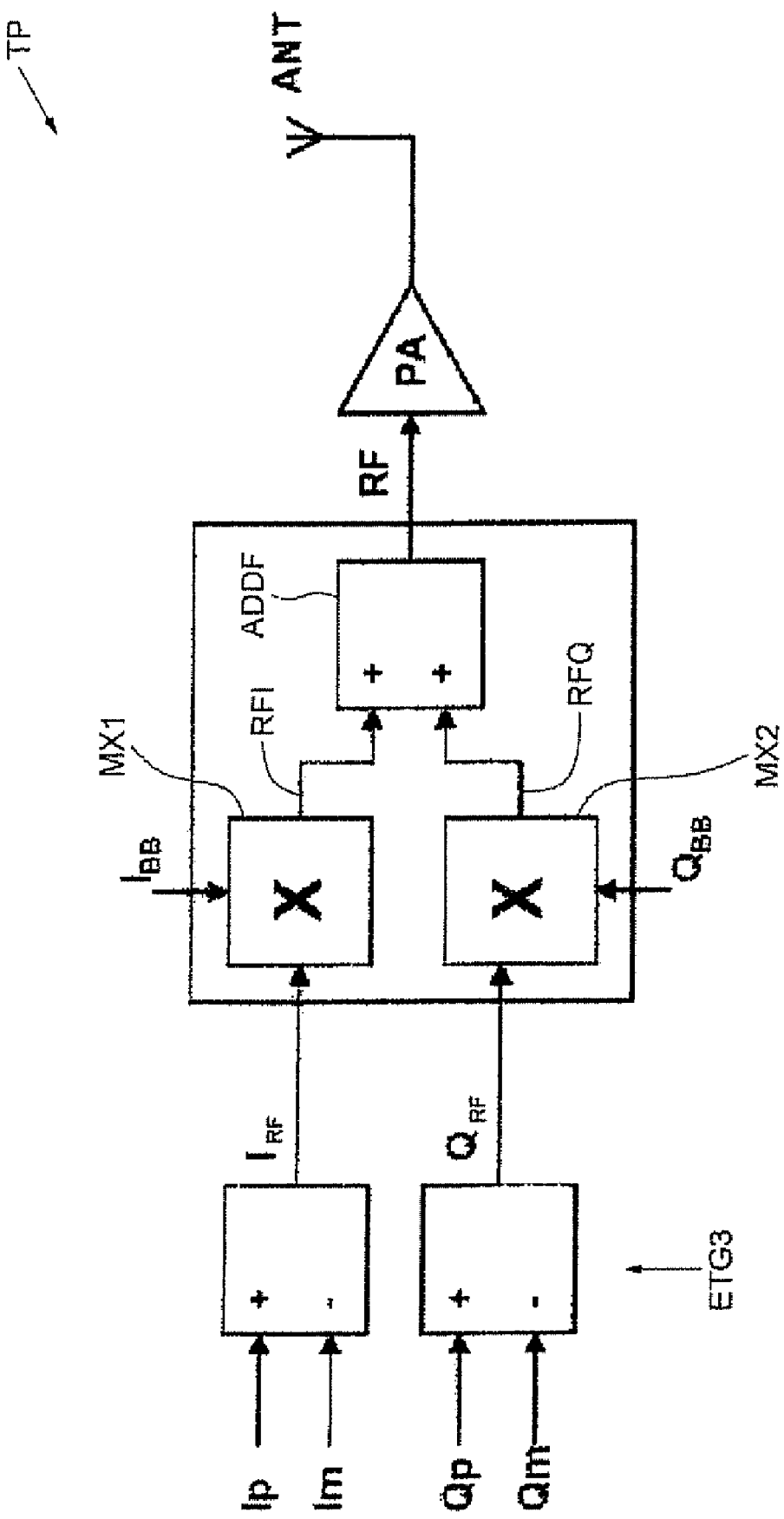

As illustrated in FIG. 21, and by analogy with FIG. 1, a first architectural solution that can be used, for example, in a cellular mobile telephone, consists in performing the frequency transposition with transposition signals derived from the stage ETG3 and therefore already having had the even harmonics removed. More specifically, the transposition signals $I_{RF}$ and $Q_{RF}$ are respectively delivered to the mixers MX1 and MX2 which also receive the baseband signals $I_{BB}$ and $Q_{BB}$ and deliver the two output signals RFI and RFQ which have a dominant harmonic at the frequency Fc. These two signals RFI and RFQ are then added in an adder ADDF before being transmitted as radiofrequency signal RF to the output amplifier PA of the telephone TP.

Figure 22:
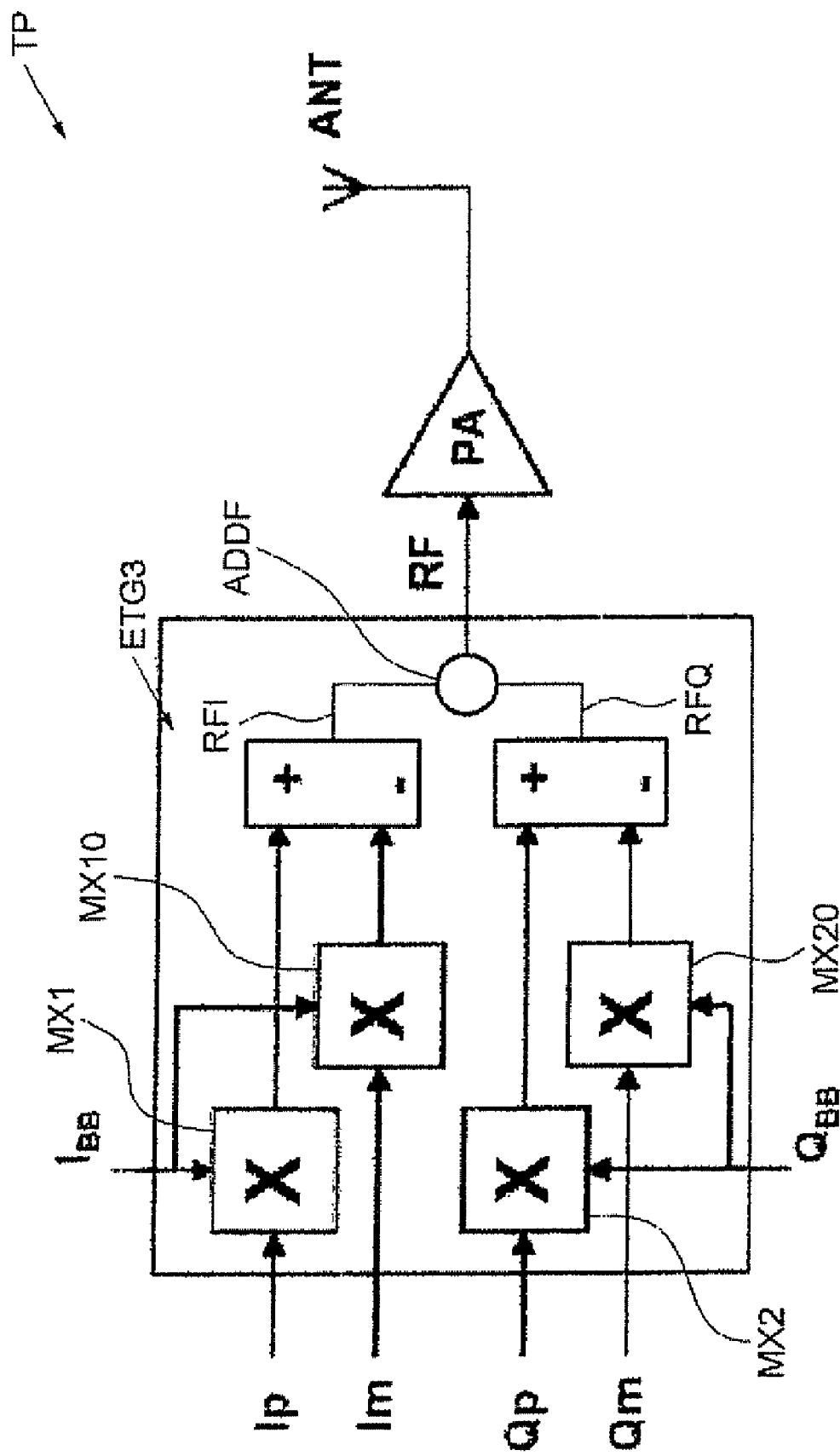

Another approach, as illustrated in FIG. 22, includes first performing the frequency transposition before the phase for eliminating even harmonics. More specifically, the signals Ip, Im are respectively delivered as transposition signals to mixers MX1 and MX10 which both receive the baseband signal $I_{BB}$. Moreover, the signals Qp and Qm are themselves respectively delivered to two mixers MX2 and MX20 as frequency transposition signals, these two mixers MX2 and MX20 also receiving the other component $Q_{BB}$ of the baseband signal The transposed signals derived from the mixers MX1 and MX10 are then mutually subtracted in a first subtractor of the stage ETG3 so as to deliver the first output signal RFI. The other two transposed signals derived from the mixers MX2 and MX20 are also mutually subtracted in the second subtractor of the substage ETG3 so as to deliver the other output signal RFQ. The two output signals RFI and RFQ are then added in the adder ADDF in order to provide the resultant signal RF to the power amplifier PA of the TP.

Figure 8:
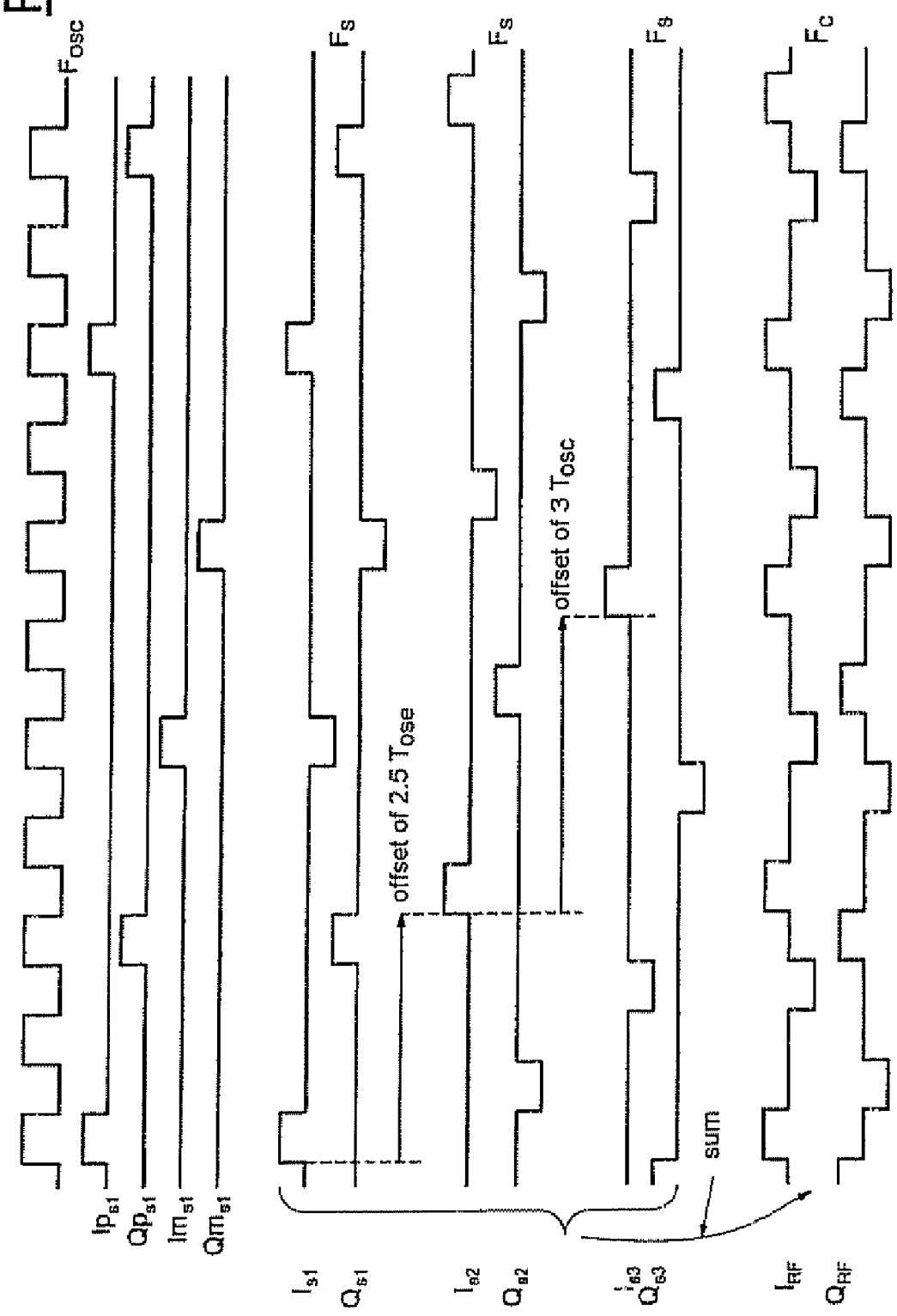
FIGS. 8 and 9 are schematic signal diagrams illustrating another exemplary method embodiment of the invention.
Figure 23:
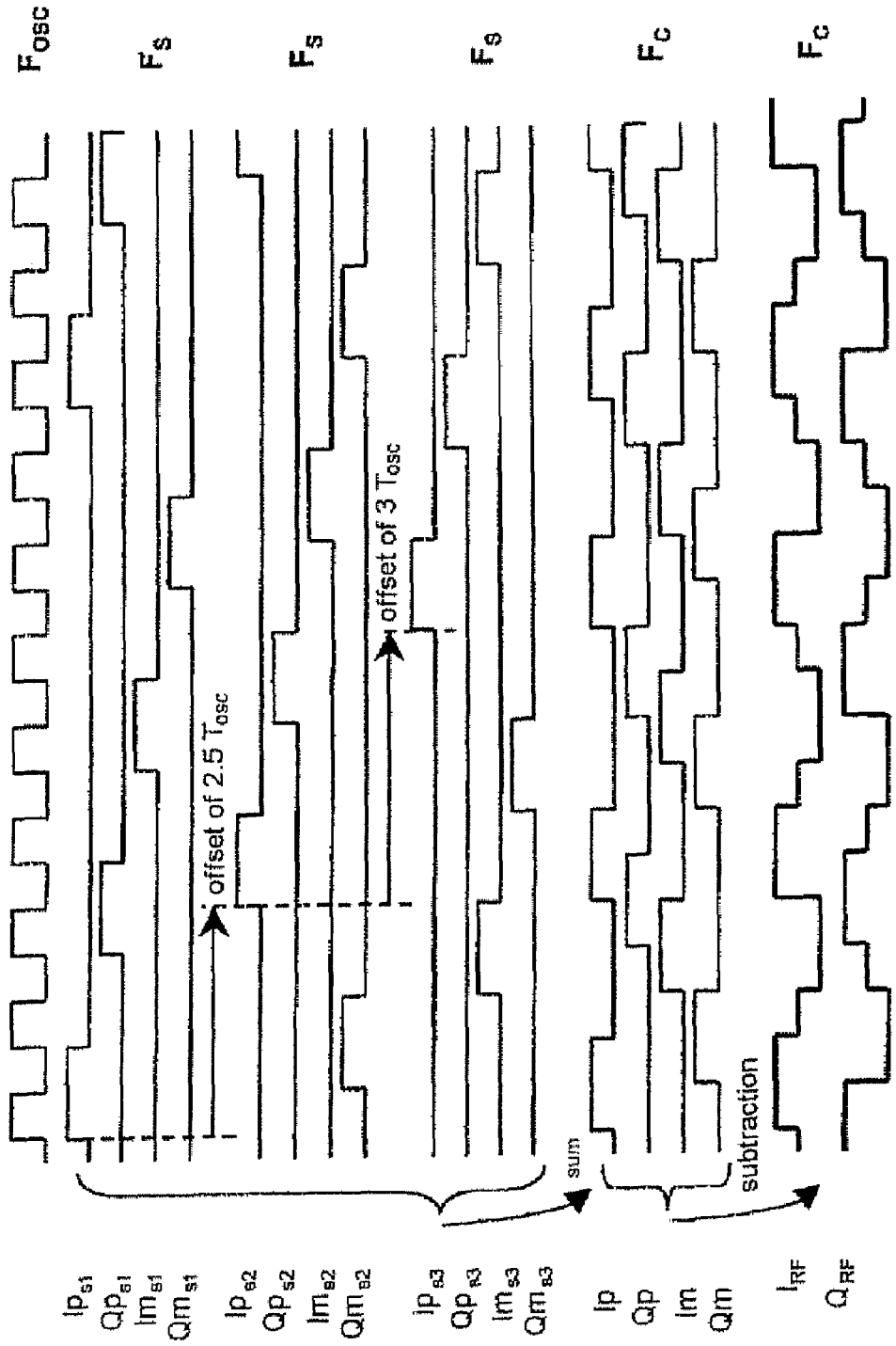
Figure 24:
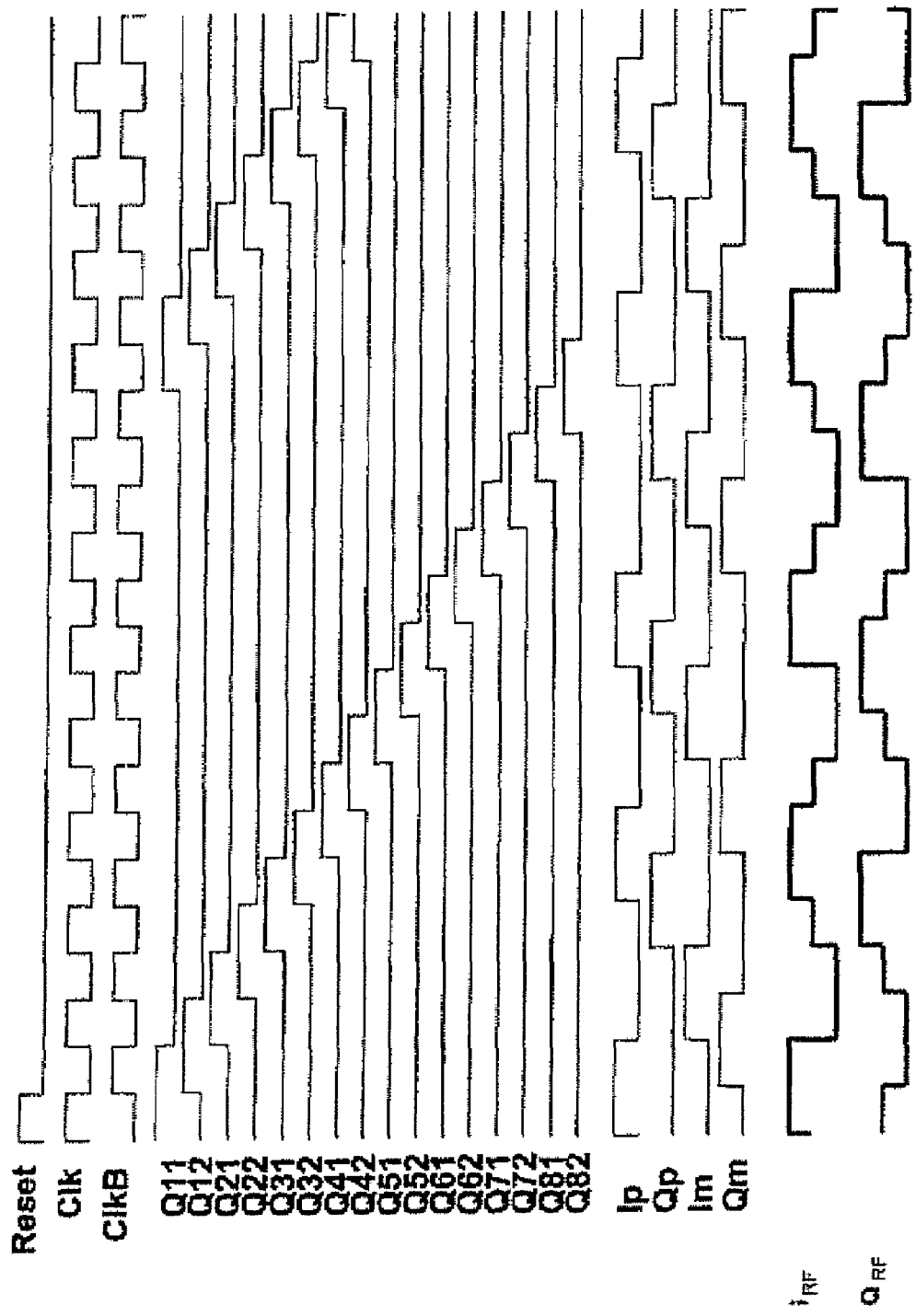

Whereas, in the embodiment illustrated in FIGS. 10 and 11, the additional pulling source is eliminated by using a post-processing stage ETP which performs an additional signal offset followed by a summation, it is possible, as illustrated in FIG. 23 for p=8, q=3, $F_{OSC}$=5.333 GHz, to eliminate this additional pulling source by doubling the width of the pulses of the signals $Ip_{S1}$, $Qp_{S1}$, $Im_{S1}$ and $Qm_{S1}$, relative to the width of the pulses of these same signals as illustrated in FIG. 8.

Then, the offsets, the summation and the subtraction are performed, and it can be seen that signals $I_{RF}$ and $Q_{RF}$ similar to the signals $I_{RF}$ and $Q_{RF}$ of FIG. 11 are obtained. Physically, the Johnson counter such as the counter CTJO3 of FIG. 19 is already used to generate pulses with the right width. Consequently, here too, after recombination, summation and subtraction, the signals $I_{RF}$ and $Q_{RF}$ similar to those of FIG. 23 are obtained again.

The invention has thus in particular made it possible to eliminate the dominant pulling source in a direct conversion transmission subsystem by the use of a non-integer rational frequency divider for generating orthogonal transposition signals such that the modulated signal presents no harmonics that coincide with the frequency of the voltage-controlled oscillator of the phase-locked loop. Moreover, an appropriate choice of the pulse width of the orthogonal transmission signals also makes it possible to eliminate the other potential pulling sources due in particular to the spurious paths of the circuit.

Furthermore, the use of a rational frequency divider makes the generation of the transposition signals insensitive to the duty cycle of the basic signal (signal from the local oscillator of the phase-locked loop). Finally, a phase-locked loop of reasonable frequency can be used, so reducing the current consumption.

That which is claimed is:

1. A method of generating two signals in phase quadrature, having a frequency spectrum including a dominant harmonic at a desired frequency $F_C$, the method including:
   generating a periodic basic signal having a frequency $F_{OSC}$ equal to a product of R and the desired frequency $F_C$, R being a non-integer rational number greater than one and equal to a ratio p/q, in which p is an integer multiple of 4 and q an odd integer;
   receiving two initial baseband signals in phase quadrature at an input interface; and
   at a processing unit connected to the input interface processing, including at least one division part for frequency division by p of the periodic basic signal, a multiplication part for frequency multiplication by q, an elimination part for eliminating even harmonics, and a frequency transposition of the two initial baseband signals using transposition signals derived from at least one of the parts and having a frequency spectrum including a dominant harmonic at the desired frequency $F_C$.

2. The method according to claim 1, wherein the processing includes the division part, the multiplication part, the elimination part, and the frequency transposition using transposition signals derived from the elimination part and including only odd harmonics.

3. The method according to claim 2, wherein the elimination part includes two signal subtractions so as to deliver a pair of signals.

4. The method according to claim 1, wherein the frequency transposition uses transposition signals derived from the multiplication part, and the elimination part includes eliminating even harmonics from the transposition signals.

5. The method according to claim 1, wherein the division part and the multiplication part include joint operations performed simultaneously and including logical combinations of signals and q-1 signal offsets by multiples of the period or of the half-period of the basic periodic signal, each multiple of the period or of the half-period being equal to a product of the period or of the half-period and an integer coefficient from a group of integers closest to one of R and 2R.

6. The method according to claim 5, wherein the division part includes a succession of frequency divisions by 2 or a modulo p count of the basic periodic signal so as to generate a succession of primary signals, and the joint operations include logical combinations of the primary signals with each other and the basic periodic signal.

7. The method according to claim 1, wherein the division part and the multiplication part include joint operations performed at the same time and including frequency division by p and q-1 signal offsets by multiples of the period or of the half-period of the basic periodic signal, each multiple of the period or of the half-period being equal to the product of the period or the half-period and an integer coefficient from a group of integers closest to one of R or 2R.

8. The method according to claim 7, wherein the multiplication part also includes a signal summation performed after the signal offsets so as to deliver two pairs of tertiary periodic signals each having the frequency $F_C$.

9. The method according to claim 5, wherein the joint operations include a generation of two pairs of groups of q signals each having a frequency $F_S$ equal to $F_C/q$, each group including a secondary periodic signal and the q-1 signals offset relative to the secondary periodic signal by the multiples of the period or of the half-period of the basic signal, the q signals of a group of each pair respectively being in phase opposition relative to the corresponding q signals of the other group of the pair, and in phase quadrature relative to the q signals of the corresponding group of the other pair.

10. The method according to claim 1, wherein the division part includes delivery of signals having pulses of width equal to twice a half-period or a period of the basic periodic signal.

11. The method according to claim 1, wherein the processing includes a part for frequency division by p with elimination of the even harmonics so as to generate two periodic intermediate signals in phase quadrature, each having a frequency $F_S$ equal to $F_C/q$, and of the odd frequency harmonics, a multiplication part for frequency multiplication by q of the two periodic intermediate signals, and the frequency transposition with transposition signals being derived from the multiplication part and including only odd harmonics.

12. The method according to claim 11, wherein the part for frequency division by p with elimination of the even harmonics includes:
    successive frequency divisions by 2 or a modulo p count of the basic signal so as to generate primary signals;
    logical combinations of the primary signals with each other and with the basic periodic signal so as to generate two pairs of secondary periodic signals each having the frequency $F_S$, the two secondary signals of each pair being in phase quadrature and the two pairs also themselves being in phase quadrature; and
    subtractions of the secondary signals so as to generate the two intermediate signals.

13. The method according to claim 12, wherein the pair of intermediate signals includes a first intermediate signal and a second intermediate signal in phase quadrature relative to the first; and wherein the frequency multiplication by q includes:
    q-1 successive offsets of the pair of intermediate signals by multiples of the period or of the half-period of the basic periodic signal so as to obtain q-1 pairs of offset signals, each pair of offset signals including a first offset signal and a second offset signal in phase quadrature relative to the first, each multiple of the period or of the half-period being equal to the product of the period or of the half-period and an integer coefficient from a group of integers closest to one of R and 2R;
    summing the first intermediate signal and of the q-1 first offset signals; and
    summing the second intermediate signal and of the q-1 second offset signals.

14. The method according to claim 13, wherein the frequency transposition is performed with the signals directly derived from the multiplication part.

15. The method according to claim 11, wherein the frequency multiplication part delivers a first preprocessed signal and a second preprocessed signal in phase quadrature relative to the first preprocessed signal; and wherein the processing also includes a post-processing of the two preprocessed signals including:
    an offset of the two preprocessed signals by the period or the half-period of the basic periodic signal so as to obtain a first offset preprocessed signal and a second offset preprocessed signal in phase quadrature relative to the first offset preprocessed signal;
    summing the first preprocessed signal and the first offset preprocessed signal, and summing the second preprocessed signal and the second offset preprocessed signal, so as to obtain the two transposition signals.

16. The method according to claim 1, wherein q is equal to three.

17. A device for generating two output signals in phase quadrature having a frequency spectrum including a dominant harmonic at a desired frequency $F_C$, the device comprising:
    a generation device to generate a periodic basic signal having a frequency $F_{OSC}$ equal to a product of R and a desired frequency $F_C$, R being a non-integer rational number greater than one and equal to a ratio p/q, in which p is an integer multiple of 4 and q is an odd integer;
    an input interface for receiving two initial baseband signals in phase quadrature; and
    a processing unit connected to the generation device and to the input interface for performing a processing including at least one division part for frequency division by p of the periodic basic signal, a multiplication part for frequency multiplication by q, an elimination part for eliminating even harmonics, and a frequency transposition of the two initial baseband signals using transposition signals derived from at least one of the parts and having a frequency spectrum including a dominant harmonic at the desired frequency $F_C$.

18. The device according to claim 17, wherein the processing unit includes:
    a first substage having an input to receive the periodic basic signal and for performing the division part;
    a second substage for performing the multiplication part;
    a third substage for performing the elimination part for elimination of the even harmonics of signals from the second substage; and
    a frequency transposition part connected to the input interface and to an output of the third substage and for delivering the two output signals.

19. The device according to claim 18, wherein the third substage is for performing subtractions of the signals from the second substage.

20. The device according to claim 18, wherein the first substage and the second substage include joint logic components for performing logical signal combinations and q-1 signal offsets by multiples of a period or of a half-period of the periodic basic signal, each multiple of the period and of the half-period being equal to a product of the period or of the half-period and an integer coefficient from a group of integers closest to one of R and 2R.

21. The device according to claim 20, wherein the first substage includes a succession of frequency dividers that divide by 2 or a modulo p counter, having an input to receive the periodic basic signal and outputs for generating a succession of primary signals to the joint logic components; and wherein the joint logic components are for performing logical combinations of the primary signals with each other and with the periodic basic signal.

22. The device according to claim 21, wherein the joint logic components include AND logic gates including at least some inverting inputs.

23. The device according to claim 18, wherein the first substage and the second substage include joint logic components for performing the frequency division by p and q-1 signal offsets by multiples of a period or of a half-period of the periodic basic signal, each multiple of the period or of the half-period being equal to a product of the period or of the half-period and an integer coefficient from a group of integers closest to one of R and 2R.

24. The device according to claim 23, wherein the joint logic components include a p-stage ring counter having an input to receive the periodic basic signal.

25. The device according to claim 24, wherein the second substage includes a summation device connected to outputs of the joint logic components and for delivering two pairs of tertiary periodic signals each having the frequency $F_C$.

26. The device according to claim 25, wherein the summation device includes two pairs of OR logic gates connected to outputs of the joint logic components.

27. The device according to claim 26, wherein the joint logic components are for generating two pairs of groups of q signals, each having a frequency $F_S$ equal to $F_C/q$, each group comprising a secondary periodic signal and the q-1 signals offset relative to the secondary periodic signal by the multiples of the period or of the half-period of the periodic basic signal, the q signals of a group of each pair being respectively in phase opposition relative to the corresponding q signals of the other group of the pair, and in phase quadrature relative to the q signals of the corresponding group of the other pair.

28. The device according to claim 27, wherein the joint logic components include two pairs of groups of q AND logic gates having at least some inverting inputs and for generating the two pairs of groups of q signals; and wherein the summation device includes two pairs of OR logic gates respectively connected to the two pairs of groups of q AND logic gates.

29. The device according to claim 28, wherein the third substage includes two subtractors respectively connected to the two pairs of OR gates.

30. The device according to claim 29, wherein the first stage delivers signals having pulses of width equal to twice the half-period or the period of the periodic basic signal.

31. Device according to claim 30, wherein the first stage includes the p-stage ring counter for delivering the signals having pulses of width equal to twice the half-period or the period of the periodic basic signal.

32. The device according to claim 17, wherein the processing unit includes:
a first substage for performing the division part;
a second substage for performing the multiplication part;
a frequency transposition part connected to the input interface and to an output of the second substage; and
a third substage for performing the elimination part for elimination of the even harmonics of signals from the frequency transposition part so as to deliver the two output signals.

33. The device according to claim 32, wherein the third substage is for performing subtractions of the signals from the frequency transposition part so as to generate the two output signals.

34. The device according to claim 17, wherein the processing unit includes a preprocessing stage including a first block for performing a frequency division by p with elimination of the even harmonics, a second block for performing a frequency multiplication by q and frequency transposition part connected to an output of the preprocessing stage and to the input interface.

35. The device according to claim 34, wherein the first block is for receiving the periodic basic signal and for delivering two periodic intermediate signals in phase quadrature, each having a frequency $F_S$ equal to $F_C/q$ and odd frequency harmonics; and wherein the second block is for performing a frequency multiplication by q of the two intermediate signals.

36. The device according to claim 35, wherein the first block comprises:
a succession of frequency dividers by 2 or a modulo p counter, having an input to receive the periodic basic signal and outputs for generating a succession of primary signals;
a logic circuit for performing logical combinations of the primary signals with each other and with the periodic basic signal so as to generate two pairs of secondary periodic signals each having the frequency $F_S$, the two secondary signals of each pair being in phase quadrature and the two pairs also being in phase quadrature; and
a subtraction circuit for performing subtractions of the secondary signals so as to generate the two intermediate signals.

37. The device according to claim 36, wherein the pair of intermediate signals comprises a first intermediate signal and a second intermediate signal in phase quadrature relative to the first, and wherein the second block comprises:
an offset unit for performing q-1 successive offsets of the pair of intermediate signals by multiples of the period or of the half-period of the periodic basic signal so as to obtain q-1 pairs of offset signals, each pair of offset signals comprising a first offset signal and a second offset signal in phase quadrature relative to the first, each multiple of the period or of the half-period being equal to a product of the period or of the half-period and an integer coefficient from the group of integers closest to one of R and 2R;
a first adder for summing the first intermediate signal and the q-1 first offset signals; and
a second adder for summing the second intermediate signal and the q-1 second offset signals.

38. The device according to claim 37, wherein the preprocessing stage is for delivering a first preprocessed signal and a second preprocessed signal in phase quadrature relative to the first preprocessed signal; and wherein the processing unit further comprises a post-processing stage for the two preprocessed signals connected between an output of the preprocessing stage and the frequency transposition part and including:
an additional offset unit for performing an offset of the two preprocessed signals by the period or the half-period of the periodic basic signal so as to obtain a first offset preprocessed signal and a second offset preprocessed signal in phase quadrature relative to the first offset preprocessed signal; and
a third adder for summing the first preprocessed signal and the first offset preprocessed signal, and a fourth adder for summing the second preprocessed signal and the second offset preprocessed signal, so as to deliver the two transposition signals.

39. The device according to claim 17, wherein, q is equal to three.

40. A terminal of a wireless communication system including a device for generating two output signals in phase quadrature having a frequency spectrum including a dominant harmonic at a desired frequency $F_C$, the device comprising:
a generation device to generate a periodic basic signal having a frequency $F_{OSC}$ equal to a product of R and a desired frequency $F_C$, R being a non-integer rational number greater than one and equal to a ratio p/q, in which p is an integer multiple of 4 and q is an odd integer;
an input interface for receiving two initial baseband signals in phase quadrature; and
a processing unit connected to the generation device and to the input interface for performing a processing including at least one division part for frequency division by p of the periodic basic signal, a multiplication part for frequency multiplication by q, an elimination part for eliminating even harmonics, and a frequency transposition of the two initial baseband signals using transposition signals derived from at least one of the parts and having a frequency spectrum including a dominant harmonic at the desired frequency $F_C$.

41. The terminal according to claim 40, wherein the terminal defines a cellular mobile telephone.

* * * * *